(12) United States Patent
Walker

(10) Patent No.: US 12,540,253 B2
(45) Date of Patent: Feb. 3, 2026

(54) CONDUCTIVE INK COMPOSITIONS

(71) Applicant: ELECTRONINKS INCORPORATED, Austin, TX (US)

(72) Inventor: Steven Brett Walker, Austin, TX (US)

(73) Assignee: ELECTRONINKS INCORPORATED, Austin, TX (US)

( * ) Notice: Subject to any disclaimer, the term of this patent is extended or adjusted under 35 U.S.C. 154(b) by 0 days.

(21) Appl. No.: 17/532,729

(22) Filed: Nov. 22, 2021

(65) Prior Publication Data

US 2022/0332967 A1 Oct. 20, 2022

Related U.S. Application Data

(60) Continuation of application No. 16/423,118, filed on May 27, 2019, now Pat. No. 11,180,673, which is a division of application No. 15/304,801, filed as application No. PCT/US2015/025953 on Apr. 15, 2015, now Pat. No. 10,301,497.

(60) Provisional application No. 61/980,863, filed on Apr. 17, 2014, provisional application No. 61/980,827, filed on Apr. 17, 2014, provisional application No. 61/980,870, filed on Apr. 17, 2014, provisional application No. 61/980,933, filed on Apr. 17, 2014.

(51) Int. Cl.
| | | |
|---|---|---|
| C09D 11/00 | (2014.01) | |
| C09D 11/52 | (2014.01) | |
| C23C 18/06 | (2006.01) | |
| C23C 18/08 | (2006.01) | |
| H01B 1/22 | (2006.01) | |
| H05K 1/09 | (2006.01) | |
| H05K 3/10 | (2006.01) | |

(52) U.S. Cl.
CPC .............. *C09D 11/52* (2013.01); *C23C 18/06* (2013.01); *C23C 18/08* (2013.01); *H01B 1/22* (2013.01); *H05K 1/092* (2013.01); *H05K 3/10* (2013.01)

(58) Field of Classification Search
CPC ......... C09D 11/52; C23C 18/06; C23C 18/08; H01B 1/22; H05K 1/092; H05K 3/10
USPC ....................................................... 427/125
See application file for complete search history.

(56) References Cited

U.S. PATENT DOCUMENTS

| | | |
|---|---|---|
| 9,469,773 B2 | 10/2016 | Walker et al. |
| 2003/0164105 A1 | 9/2003 | Tashiro |
| 2009/0209693 A1 | 8/2009 | Suganuma et al. |
| 2010/0166948 A1* | 7/2010 | Cho .................... C03C 17/3405 427/108 |
| 2010/0189901 A1 | 7/2010 | Chung |
| 2011/0005428 A1 | 1/2011 | Heo |
| 2013/0121872 A1 | 5/2013 | Matsumoto |
| 2013/0334470 A1 | 12/2013 | Kurihara |
| 2014/0346412 A1 | 11/2014 | Okamoto |
| 2015/0008376 A1 | 1/2015 | Hirose |
| 2015/0217375 A1 | 8/2015 | Iguchi |
| 2015/0225588 A1 | 8/2015 | Iguchi et al. |
| 2015/0245480 A1 | 8/2015 | Kubo et al. |
| 2015/0259557 A1 | 9/2015 | Sekiguchi et al. |

FOREIGN PATENT DOCUMENTS

| | | | | |
|---|---|---|---|---|
| CN | 102321402 A | | 1/2012 | |
| JP | 2008176951 A | | 7/2008 | |
| JP | 2009114232 A | | 5/2009 | |
| JP | 2009197133 A | | 9/2009 | |
| JP | 2013142173 A | | 7/2013 | |
| JP | 2013178983 A | * | 9/2013 | |
| JP | 2014034602 A | | 2/2014 | |
| KR | 20080013787 A | * | 2/2008 | ............. C09D 11/52 |
| KR | 20080030794 A | * | 4/2008 | ............. B22F 1/054 |
| WO | 2012105682 A1 | | 8/2012 | |
| WO | 2013036519 A1 | | 3/2013 | |
| WO | 2013096664 A1 | | 6/2013 | |
| WO | 2013111856 A1 | | 8/2013 | |
| WO | 2014021270 A1 | | 2/2014 | |
| WO | 2014024901 A1 | | 2/2014 | |

OTHER PUBLICATIONS

Walker et al. (2012) J. Am. Chem. Soc., 134 (3), pp. 1419-1421.

* cited by examiner

*Primary Examiner* — James E McDonough
(74) *Attorney, Agent, or Firm* — VLP Law Group LLP; David A. Roise

(57) ABSTRACT

A conductive structure is provided. The conductive ink composition includes a silver complex formed by mixing a silver carboxylate, at least one dissolving agent that dissolves the silver carboxylate, and a catalyst. The catalyst includes an amine that decarboxylates the silver carboxylate to make the conductive ink composition. The catalyst decarboxylates the silver carboxylate at a temperature of 100° C. or less. An ink composition comprising a metallic salt with a sterically bulky counter ion and a ligand is also provided. An ink composition for making a conductive structure, comprising a reducible metal complex formed by mixing: a reducing agent, wherein the reducing agent is dissolved in a dissolving agent; and at least one metal salt or metal complex comprising a Group 4, 5, 6, 7, 8, 9, 10, 11, or 12 metal, wherein the reducing agent reduces the metal to forms the conductive structure is further provided.

13 Claims, No Drawings

CONDUCTIVE INK COMPOSITIONS

RELATED APPLICATIONS

This application is a continuation of U.S. patent application Ser. No. 16/423,118, filed May 27, 2019, which is a divisional of U.S. patent application Ser. No. 15/304,801, filed Oct. 17, 2016, now U.S. Pat. No. 10,301,497, which is a U.S. national stage entry based on International Application No. PCT/US2015/025953, filed Apr. 15, 2015, which in turn claims priority to U.S. Provisional Application Ser. No. 61/980,863, filed Apr. 17, 2014; U.S. Provisional Application Ser. No. 61/980,933, filed Apr. 17, 2014; U.S. Provisional Application Ser. No. 61/980,827, filed Apr. 17, 2014; and U.S. Provisional Application Ser. No. 61/980,870, filed Apr. 17, 2014, each of which is hereby incorporated by reference herein in its entirety.

FIELD OF THE INVENTION

The present disclosure relates generally to novel ink compositions. More particularly, the present disclosure relates to a process for the preparation of novel ink formulations based on metallic compositions.

BACKGROUND OF THE INVENTION

The electronics, display, and energy industries rely on the production and use of coatings and patterns of conductive materials to form circuits on organic and inorganic substrates. Printed electronics offer an attractive alternative to conventional technologies by enabling the creation of large-area, flexible devices at low cost. There are a plethora of applications for high-conductivity materials with fine-scale features in modern electronics such as solar cell electrodes, flexible displays, radio frequency identification tags, antennas, and many more. In efforts to make these high-technology devices increasingly affordable, the substrates used typically have relatively little temperature resilience and require low processing temperatures to maintain integrity.

The vast majority of commercially produced conductive inks are specifically designed for inkjet, screen-printing, or roll-to-roll processing methods in order to process large areas with fine-scale features in short time periods. These inks have disparate viscosities and synthesis parameters. Particle-based inks are based on conductive metal particles, which are typically synthesized separately and then incorporated into an ink formulation. The resulting ink is then tuned for specific particle process.

Typically, precursor-based inks are based on thermally unstable precursor complexes that reduce to a conductive metal upon heating. Prior particle- and precursor-based methods generally rely on high temperatures to form conductive coatings and thus may not be compatible with substrates that require low processing temperatures to maintain integrity. For example, silver compounds with carbamate or other relatively low molecular weight ligands (compared to polymer stabilizers) have been synthesized that decompose at temperatures near 150° C., yielding electrical conductivities approaching that of bulk silver. Unfortunately, even these temperatures render the ink incompatible with many plastic and paper substrates used in flexible electronic and biomedical devices.

Therefore, it is an object of the present invention to provide improved ink compositions.

BRIEF SUMMARY

An improved ink composition for forming a conductive from reactive metals and alloys and a method of making a conductive structure are disclosed.

In one aspect, a conductive ink composition includes a silver complex formed by mixing a silver carboxylate; at least one dissolving agent that dissolves the silver carboxylate; and a catalyst, wherein the catalyst comprises an amine that decarboxylates the silver carboxylate to make the conductive ink composition, wherein the catalyst decarboxylates the silver carboxylate at a temperature of 200° C. or less.

In another aspect, a conductive ink composition includes a silver complex formed by mixing a silver carboxylate, wherein the silver carboxylate comprises silver; at least one dissolving agent that dissolves the silver carboxylate; and a catalyst that reduces the silver of the silver carboxylate to make the conductive ink composition, wherein the catalyst comprises an amine. The catalyst reduces the silver of the silver carboxylate at a temperature of 200° C. or less.

In another aspect, a method of making a conductive structure includes decarboxylating a silver carboxylate in the presence of an amine to form a silver complex, wherein the silver carboxylate is dissolved in a dissolving agent; applying the silver complex to a substrate; and heating the silver complex on the substrate at a decomposition temperature of about 200° C. or less to form the conductive structure.

In another aspect, an ink composition includes a metallic salt with a sterically bulky counter ion and a ligand.

In another aspect, a method of making an ink is disclosed. The method comprises a step of adding a metallic salt with a sterically bulky counter ion into a solvent to form a first mixture; and adding a ligand to the first mixture to form an ink composition.

In another aspect, a method of making a conductive structure comprises adding a metallic salt with a sterically bulky counter ion in a solvent to form a first mixture; adding a ligand to the first mixture to form an ink composition; and heating the ink composition to form a conductive structure.

In another aspect, an ink composition for making a conductive structure includes a reducible metal complex formed by mixing a reducing agent, wherein the reducing agent is dissolved in a dissolving agent; and at least one metal salt or metal complex comprising a metal, wherein the reducing agent reduces the metal of the metal salt or metal complex to form the conductive structure.

In another aspect, an ink composition for making a conductive structure includes a reducible metal complex formed by mixing a reducing agent, wherein the reducing agent is dissolved in a dissolving agent; and at least one metal salt or metal complex comprising a Group 4, 5, 6, 7, 8, 9, 10, 11, or 12 metal, wherein the reducing agent reduces the metal to form the conductive structure, wherein the reducing agent reduces the metal of the metal salt or metal complex to form the conductive structure.

In another aspect, a method of making a conductive structure includes mixing a reducing agent with at least one metal salt or metal complex to form a reducible metal complex, wherein the reducing agent is dissolved in at least one dissolving agent; applying the reducible metal complex to a substrate; and decomposing the reducible metal complex on the substrate to form the conductive structure.

DETAILED DESCRIPTION

Method of Creating a Conductive Structure from a Silver Precursor

Compositions and methods of making the compositions to provide a conductive ink structure are disclosed. Ink compositions derived from silver metal precursors have been described in International Application No. PCT/US2012/071034 entitled "Ink Composition for Making a Conductive Silver Structure," which was filed on Dec. 20, 2012, and is hereby incorporated by reference in its entirety.

Disclosed are improved ink compositions formed by making silver complexes that do not require high decomposition temperatures. By employing lower decomposition temperatures and reduced tack times to form the conductive structures, the improved ink compositions are compatible with more substrates that do not require high processing temperatures to maintain integrity. Further, the method for making the ink compositions is both simple and high-yielding.

The ink compositions may possess low viscosity so that it is compatible with a broad range of patterning techniques, including slot die coating, spin coating, roll-to-roll printing, including gravure, flexography, rotary screen printing, screen-printing, aerosol jet printing, inkjet printing, airbrushing, Mayer rod coating, flood coating, 3D printing, and electrohydrodynamic printing. The patterned features may be highly conductive at room temperature and achieve bulk conductivity upon decomposing at mild temperatures (e.g., less than about 100° C.). Finally, the ink may remain stable at room temperature for months without particle precipitation.

Accordingly, a conductive ink composition (also referred to as a "conductive ink" or an "ink") has been created for printing highly conductive features at room temperature. Such inks may be stable, particle-free, and suitable for a wide range of patterning techniques. In one embodiment, a "particle-free" ink is one that does not include any particles at a diameter of greater than about 10 nm. In one embodiment, a "particle-free" ink is one that has less than about 1% particles, preferably less than about 0.1% particles. Silver salt is employed in the ink as a precursor material, which ultimately yields the silver in the conductive silver coatings, lines, or patterns. Any suitable silver precursor may be used.

In one aspect, a conductive ink composition includes a silver complex formed by mixing a silver carboxylate, at least one dissolving agent that dissolves the silver carboxylate, and a catalyst. The catalyst includes an amine that decarboxylates the silver carboxylate to make the conductive ink composition. In one embodiment, the silver carboxylate is soluble in the dissolving agent. Solubility, as known to one of ordinary skill, is the property of a substance, such as a silver carboxylate, to dissolve in a solvent, such as a dissolving agent. In one embodiment, the silver complex is first applied to a substrate. In one embodiment, the catalyst decarboxylates the silver carboxylate at a temperature of about 200° C. or less. In one embodiment, the catalyst decarboxylates the silver carboxylate at a temperature of about 100° C. or less. In some embodiments, the catalyst decarboxylates the silver carboxylate at a temperature of about 220° C., of about 210° C. or less, of about 190° C. or less, of about 180° C. or less, of about 170° C. or less, of about 160° C. or less, of about 150° C. or less, of about 140° C. or less, of about 130° C. or less, of about 120° C. or less, of about 110° C. or less, of about 90° C. or less, of about 80° C. or less, of about 70° C. or less, of about 60° C. or less, or of about 50° C. or less.

In another aspect, a conductive ink composition includes a silver complex formed by mixing a silver carboxylate, at least one dissolving agent that dissolves the silver carboxylate, and a catalyst that reduces the silver of the silver carboxylate. In one embodiment, the silver carboxylate is soluble in the dissolving agent. The catalyst includes an amine. In one embodiment, the silver complex is first applied to a substrate. In one embodiment, the catalyst reduces the silver of the silver carboxylate at a temperature of about 200° C. or less. In one embodiment, the catalyst reduces the silver of the silver carboxylate at a temperature of about 100° C. or less. In some embodiments, the catalyst reduces the silver of the silver carboxylate at a temperature of about 210° C. or less, of about 220° C. or less, of about 190° C. or less, of about 180° C. or less, of about 170° C. or less, of about 160° C. or less, of about 150° C. or less, of about 140° C. or less, of about 130° C. or less, of about 120° C. or less, of about 110° C. or less, of about 90° C. or less, of about 80° C. or less, of about 70° C. or less, of about 60° C. or less, or of about 50° C. or less.

Silver Carboxylates

In one embodiment, the silver carboxylate includes silver salts of aliphatic carboxylic acids. In one embodiment, the silver carboxylate includes silver salts of long-chain aliphatic carboxylic acids. In one embodiment, a silver carboxylate includes a silver salt of a long chain aliphatic carboxylic acid having 10 to 30 carbon atoms. In one embodiment, the catalyst reduces the silver of the silver carboxylate at elevated temperatures.

In one embodiment, the silver carboxylate is selected from the group consisting of silver propionate, silver butyrate, silver pentanoate, silver hexanoate, silver heptanoate, silver ethylhexanoate, silver behenate, silver oleate, silver octanoate, silver nonanoate, silver decanoate, silver neodecanoate, silver hexafluoroacetylacetonate. In one embodiment, the silver carboxylate is silver neodecanoate. In one embodiment, the silver carboxylate is silver hexafluoroacetylacetonate. In one embodiment, the silver carboxylate is silver propionate. In one embodiment, the silver carboxylate is silver butyrate. In one embodiment, the silver carboxylate is silver pentanoate. In one embodiment, the silver carboxylate is silver hexanoate. In one embodiment, the silver carboxylate is silver heptanoate. In one embodiment, the silver carboxylate is silver ethylhexanoate. In one embodiment, the silver carboxylate is silver behenate. In one embodiment, the silver carboxylate is silver oleate. In one embodiment, the silver carboxylate is silver nonanoate. In one embodiment, the silver carboxylate is silver decanoate.

In one embodiment, an amount from about 0.4 grams to about 0.6 grams of silver carboxylate is dissolved in the dissolving agent. In some embodiments, about 0.4 grams, about 0.5 grams, or about 0.6 grams silver carboxylate is dissolved in the dissolving agent. In one embodiment, an amount from about 0.4 grams to about 0.6 grams of silver neodecanoate is dissolved in the dissolving agent. In some embodiments, about 0.4 grams, about 0.5 grams, or about 0.6 grams silver neodecanoate is dissolved in the dissolving agent. In one embodiment, an amount from about 0.4 grams to about 0.6 grams of silver hexafluoroacetylacetonate is dissolved in the dissolving agent. In some embodiments, about 0.4 grams, about 0.5 grams, or about 0.6 grams silver hexafluoroacetylacetonate is dissolved in the dissolving agent.

Dissolving Agents

As mentioned above, at least one dissolving agent dissolves the disclosed silver carboxylates. The dissolving agent acts as a stabilizer and a solvent for the silver carboxylate. The dissolving agent is not intended to act as a reducing agent for the silver carboxylate. In one embodiment, the dissolving agent has a boiling point of about 200° C. or less. In one embodiment, the dissolving agent has a boiling point of about 100° C. or less. In some embodiments, the dissolving agent has a boiling point of about 220° C. or less, about 210° C. or less, about 190° C. or less, about 180° C. or less, about 170° C. or less, about 160° C. or less, about 150° C. or less, of about 140° C. or less, of about 130° C. or less, of about 120° C. or less, of about 110° C. or less, of about 90° C. or less, of about 80° C. or less, of about 70° C. or less, of about 60° C. or less, or of about 50° C. or less.

In one embodiment, the dissolving agent may be selected based on the type of silver carboxylate used to make the ink composition. In one embodiment, the dissolving agent may be selected based on the boiling point/tack time for a specific application. In one embodiment, the dissolving agent may be selected based on the type of substrate the ink composition will be applied to for compatibility and wettability issues. For example, for deposition methods such as inkjet printing or e-jet, greater stability is generally preferred, and thus it may be preferable to use a dissolving agent with a higher boiling point.

In one embodiment, the dissolving agent is selected from the group consisting of: an organic solvent, a chelating agent, and combinations thereof. In one embodiment, the dissolving agent is at least one organic solvent. In one embodiment, the dissolving agent is at least one nonpolar organic solvent. In one embodiment, the dissolving agent is at least one chelating agent. In one embodiment, the diluting agent is a mixture of one or more dissolving agents and one or more chelating agents.

In one embodiment, the dissolving agent is selected from the group consisting of alkane hydrocarbons, carbamates, alkenes, cyclic hydrocarbons, aromatic hydrocarbons, amines, polyamines, amides, ethers, esters, alcohols, thiols, thioethers, phosphines, and combinations thereof.

In one embodiment, the dissolving agent is an organic solvent. In one embodiment, the dissolving agent may include one or more linear or branched alkane hydrocarbons of length $C_{5-20}$. For example, the dissolving agent may include pentane, hexane, heptane, octane, nonane, decane, undecane, dodecane, tridecane, tetradecane, pentadecane, hexadecane, octadecane, nonadecane, and icosane.

In one embodiment, the dissolving agent may include one or more cyclic hydrocarbons of length $C_{6-20}$. For example, the dissolving agent may include cyclohexane, cycloheptane, cyclooctane, cyclononane, cyclodecane, and decalin. In one embodiment, the dissolving agent may include aromatic hydrocarbons. For example, the dissolving agent may include benzene, toluene, xylene, and tetralin. In one embodiment, the dissolving agent is xylene.

In one embodiment, the dissolving agent may include a linear ether, a branched ether, or a cyclic ether. In one embodiment, the dissolving agent may include a linear or branched ether. For example, the dissolving agent may include dimethyl ether, diethyl ether, dipropyl ether, dibutyl ether, and methyl t-butyl ether. In one embodiment, the dissolving agent may include one or more cyclic ethers. For example, the dissolving agent may include tetrahydrofuran, tetrahydropyran, dihydropyran, and 1,4-dioxane.

In one embodiment, the dissolving agent is an alcohol. In one embodiment, the dissolving agent is a primary alcohol, a secondary alcohol, or tertiary alcohol. In one embodiment, the alcohol is selected from the group consisting of propanols, butanols, pentanols, hexanols, and octanols combinations thereof. In one embodiment, the alcohol is selected from the group consisting of 1-propanol, 2-propanol, 1-methoxy-2-propanol, 1-butanol, 2-butanol, 1-pentanol, 2-pentanol, 3-pentanol, 1-hexanol, 2-hexanol, 3-hexanol, 1-octanol, 2-octanol, 3-octanol, tetrahydrofurfuryl alcohol, cyclopentanol, terpineol, and combinations thereof. In one embodiment, the dissolving agent is terpineol.

In one embodiment, the dissolving agent is a chelating agent. In one embodiment, the dissolving agent is selected from the group consisting of ethylenediaminetetraacetic acid, iminodiacetic acid, ethylenediamine-di(o-hydroxyphenylacetic acid), nitrilotriacetic acid, dihydroxyethylglycine, trans-1,2-cyclohexanediaminetetraacetic acid, diethylenetriamine-N,N,N',N'',N''-pentaacetic acid, glycoletherdiamine-N,N,N',N'-tetraacetic acid, dimethyl sulfoxide, diethylenetriamine, tert-octylamine, tert-butylamine, 2-ethylhexylamine, and ethylene diamine. In one embodiment, the dissolving agent is tert-octylamine. In one embodiment, the dissolving agent is tert-butylamine. In one embodiment, the dissolving agent is 2-ethylhexylamine.

In one embodiment, an amount of dissolving agent is added so that the silver carboxylate is substantially dissolved or completely dissolved in the dissolving agent. In one embodiment, "substantially dissolved" means the silver carboxylate has a solubility in the dissolving agent at 25° C. of about 400 g/L.

In one embodiment, the silver carboxylate dissolves in an amount from about 0.5 mL to about 2.0 mL dissolving agent. In one embodiment, the silver carboxylate dissolves in an amount from about 1.0 mL to about 2.0 mL dissolving agent. In some embodiments, the silver carboxylate dissolves in about 0.5 mL, about 1.0 mL, about 1.5 mL, or about 2.0 mL dissolving agent.

In one embodiment, the silver carboxylate dissolves in an amount from about 0.5 mL to about 2.0 mL xylene. In one embodiment, the silver carboxylate dissolves in an amount from about 1.0 mL to about 2.0 mL xylene. In some embodiments, the silver carboxylate dissolves in about 0.5 mL, about 1.0 mL, about 1.5 mL, or about 2.0 mL xylene.

In one embodiment, the silver carboxylate dissolves in an amount from about 0.5 mL to about 2.0 mL terpineol. In one embodiment, the silver carboxylate dissolves in an amount from about 1.0 mL to about 2.0 mL terpineol. In some embodiments, the silver carboxylate dissolves in about 0.5 mL, about 1.0 mL, about 1.5 mL, and about 2.0 mL terpineol.

In one embodiment, the silver carboxylate dissolves in an amount from about 0.5 mL to about 2.0 mL of a mixture of xylene and terpineol. In one embodiment, the silver carboxylate dissolves in an amount from about 1.0 mL to about 2.0 mL of a mixture of xylene and terpineol. In some embodiments, the silver carboxylate dissolves in about 0.5 mL, about 1.0 mL, about 1.5 mL, or about 2.0 mL of a mixture of xylene and terpineol.

In one embodiment, the dissolving agent comprises two organic solvents. In one embodiment, the volume ratio of two organic solvents is about 1 to about 1 of the first organic solvent to the second organic solvent. In one embodiment, the volume ratio of the two organic solvents is about 2 to about 1 of the first organic solvent to the second organic solvent. In one embodiment, the volume ratio of the two organic solvents is about 3 to about 1 of the first organic solvent to the second organic solvent. In one embodiment, the volume ratio of the two organic solvents is about 4 to about 1 of the first organic solvent to the second organic solvent.

In one embodiment, the dissolving agent comprises two chelating agents. In one embodiment, the volume ratio of two chelating agents is about 1 to about 1 of the first chelating agent to the second chelating agent. In one embodiment, the volume ratio of the two chelating agents is about 2 to about 1 of the first chelating agent to the second chelating agent. In one embodiment, the volume ratio of the two chelating agents is about 3 to about 1 of the first chelating agent to the second chelating agent. In one embodiment, the volume ratio of the two chelating agents is about 4 to about 1 of the first chelating agent to the second chelating agent.

In one embodiment, the dissolving agent comprises one organic solvent and one chelating agent. In one embodiment, the volume ratio of the organic solvent to the chelating agent is about 1 to about 1. In one embodiment, the volume ratio of the organic solvent to the chelating agent is about 2 to about 1. In one embodiment, the volume ratio of the organic solvent to the chelating agent is about 3 to about 1. In one embodiment, the volume ratio of the organic solvent to the chelating agent is about 4 to about 1. In one embodiment, the volume ratio of the organic solvent to the chelating agent is about 1 to about 2. In one embodiment, the volume ratio of the organic solvent to the chelating agent is about 1 to about 3. In one embodiment, the volume ratio of the organic solvent to the chelating agent is about 1 to about 4.

Catalysts

As previously discussed, catalysts are disclosed. In one embodiment, the catalyst is a reducing agent. In one embodiment, the catalyst reduces a silver salt to a silver metal. In one embodiment, the catalyst is a decarboxylating agent. In one embodiment, the catalyst decarboxylates the silver carboxylate to make the conductive ink composition. In one embodiment, the catalyst reduces the silver of the silver carboxylate to make the conductive ink composition. In one embodiment, the catalyst is both a decarboxylating agent and a reducing agent. In one embodiment, the catalyst simultaneously decarboxylates the silver carboxylate and reduces the silver of the silver carboxylate to make the conductive ink composition.

Any suitable silver precursor may be used. In one embodiment, the silver precursor comprises Ag(I) or the +1 oxidation state. In one embodiment, the silver precursor comprises Ag(II) or the +2 oxidation state. In one embodiment, the silver precursor comprises Ag(III) or the +3 oxidation state. In one embodiment, an amount of catalyst is added to completely reduce the silver salt to a silver metal with an oxidation state of 0. In one embodiment, a relatively small amount of catalyst is added. In one embodiment, the amount of catalyst added depends on the desired viscosity of the ink.

In one embodiment, the catalyst is capable of reducing a silver ion ($Ag^+$) to a silver metal ($Ag^0$). In one embodiment, the catalyst is capable of reducing a silver ion ($Ag^{2+}$) to a silver metal ($Ag^0$). In one embodiment, the catalyst is capable of reducing a silver ion ($Ag^{3+}$) to a silver metal ($Ag^0$).

In one aspect, the catalyst is an amine. In one embodiment, the catalyst is a primary amine, a secondary amine, a tertiary amine, or a polyamine. In one embodiment, the catalyst is a primary amine. "Primary amine" refers to amines having two hydrogen atoms bonded to the nitrogen of the amine group. In one embodiment, the catalyst is an alkylamine having carbon numbers of 1 to 18. For example, the catalyst may include methylamine, ethylamine, propylamine, butylamine, pentylamine, hexylamine, heptylamine, octylamine, nonylamine, decylamine, undecylamine, dodecylamine, tridecylamine, tetradecylamine, pentadecylamine, hexadecylamine, heptadecylamine, octadecylamine, and combinations thereof. Other examples of catalysts that may be used include allylamine, n-propylamine, iso-propylamine, n-butylamine, sec-butylamine, tert-butylamine, n-pentylamine, isopentylamine, 2-ethylhexylamine, tert-hexylamine, phenylamine, cyclopentylamine, tert-octylamine, tert-decylamine, tert-dodecylamine, tert-octadecylamine, and combinations thereof. In one embodiment, the catalyst is tert-octylamine. In one embodiment, the catalyst is 2-ethylhexylamine.

In one embodiment, the catalyst may include a secondary amine. "Secondary amine" refers to amines having one hydrogen atom bonded to the nitrogen of the amine group. For example, the catalyst may include dimethylamine, diethylamine, dipropylamine, dibutylamine, diphenylamine, dicyclopentylamine, methylbutylamine, and combinations thereof.

In one embodiment, the catalyst may include a tertiary amine. "Tertiary amine" refers to amines having no hydrogen atoms bonded to the nitrogen of the amine group. For example, the catalyst may include trimethylamine, triethylamine, tripropylamine, triphenylamine and combinations thereof.

In one embodiment, the catalyst may include a polyamine. For example, the catalyst may include ethylene diamine, 1,3-diaminopropane, hexamethylenediamine, and combinations thereof. In one embodiment, the catalyst is ethylene diamine. In one embodiment, the catalyst is 1,3-diaminopropane. In one embodiment, the catalyst is hexamethylenediamine.

In one embodiment, the silver complex is formed by adding from about 0.1 mL to about 1 mL of catalyst. In one embodiment, the silver complex is formed by adding from about 0.1 mL to about 0.8 mL of catalyst. In one embodiment, the silver complex is formed by adding from about 0.1 mL to about 0.7 mL of catalyst. In one embodiment, the silver complex is formed by adding from about 0.1 mL to about 0.6 mL of catalyst. In one embodiment, the silver complex is formed by adding from about 0.2 mL to about 0.6 mL of catalyst. In one embodiment, the silver complex is formed by adding from about 0.2 mL to about 0.5 mL of catalyst. In one embodiment, the silver complex is formed by adding from about 0.2 mL to about 0.6 mL of catalyst. In one embodiment, the silver complex is formed by adding from about 0.3 mL to about 0.4 mL of catalyst. In some embodiments, the silver complex is formed by adding about 0.1 mL, about 0.2 mL, about 0.3 mL, about 0.4 mL, about 0.5 mL, about 0.6 mL, about 0.7 mL, about 0.8 mL, about 0.9 mL, or about 1.0 mL catalyst.

In one embodiment, the silver complex is formed by adding from about 0.1 mL to about 1 mL of tert-octylamine. In one embodiment, the silver complex is formed by adding from about 0.1 mL to about 0.8 mL of tert-octylamine. In one embodiment, the silver complex is formed by adding from about 0.1 mL to about 0.7 mL of tert-octylamine. In one embodiment, the silver complex is formed by adding from about 0.1 mL to about 0.6 mL of tert-octylamine. In one embodiment, the silver complex is formed by adding from about 0.2 mL to about 0.6 mL of tert-octylamine. In one embodiment, the silver complex is formed by adding from about 0.2 mL to about 0.5 mL of tert-octylamine. In one embodiment, the silver complex is formed by adding from about 0.2 mL to about 0.6 mL of tert-octylamine. In one embodiment, the silver complex is formed by adding from about 0.3 mL to about 0.4 mL of tert-octylamine. In other embodiments, the silver complex is formed by adding tert-octylamine in an amount of about 0.1 mL, about 0.2 mL, about 0.3 mL, about 0.4 mL, about 0.5 mL, about 0.6 mL, about 0.7 mL, about 0.8 mL, about 0.9 mL, or about 1.0 mL.

In one embodiment, the silver complex is formed by adding from about 0.1 mL to about 1 mL of 2-ethylhexylamine. In one embodiment, the silver complex is formed by adding from about 0.1 mL to about 0.8 mL of 2-ethylhexylamine. In one embodiment, the silver complex is formed by adding from about 0.1 mL to about 0.7 mL, of 2-ethylhexylamine. In one embodiment, the silver complex is formed by adding from about 0.1 mL to about 0.6 mL of 2-ethylhexylamine. In one embodiment, the silver complex is formed by adding from about 0.2 mL to about 0.6 mL of 2-ethylhexylamine. In one embodiment, the silver complex is formed by adding from about 0.2 mL to about 0.5 mL of 2-ethylhexylamine. In one embodiment, the silver complex is formed by adding from about 0.2 mL to about 0.6 mL of 2-ethylhexylamine. In one embodiment, the silver complex is formed by adding from about 0.3 mL to about 0.4 mL of 2-ethylhexylamine. In other embodiments, the silver complex is formed by adding 2-ethylhexylamine in the amount of about 0.1 mL, about 0.2 mL, about 0.3 mL, about 0.4, about 0.5 mL, about 0.6 mL, about 0.7 mL, about 0.8 mL, about 0.9 mL, or about 1.0 mL.

In one aspect, the catalyst is the dissolving agent. In one embodiment, a conductive ink composition includes a silver complex formed by mixing a silver carboxylate with a catalyst. In one embodiment, the silver carboxylate dissolves in the catalyst. The catalyst also serves as a reducing agent. The catalyst includes an amine that reduces the silver carboxylate to make the conductive ink composition. In one embodiment, tert-octylamine dissolves the silver carboxylate and reduces the silver carboxylate. In one embodiment, tert-butylamine dissolves the silver carboxylate and reduces the silver carboxylate. In one embodiment, 2-ethylhexylamine dissolves the silver carboxylate and reduces the silver carboxylate.

Conductive Ink Composition Combinations of Silver Carboxylates, Dissolving Agents, and Catalysts In one embodiment, the silver carboxylate is silver neodecanoate. In one embodiment, the silver carboxylate is silver hexafluoroacetylacetonate. In one embodiment, the dissolving agent is xylene. In one embodiment, the dissolving agent comprises xylene and terpineol. In one embodiment, the catalyst is tert-octylamine. In one embodiment, the catalyst is 2-ethylhexylamine.

In one embodiment, the conductive ink composition has a concentration of about 1 to about 40 wt. % silver of the conductive ink composition. In one embodiment, the conductive ink composition has a concentration of about 1 to about 30 wt. % silver of the conductive ink composition. In one embodiment, the conductive ink composition has a concentration of about 1 to about 20 wt. % silver of the conductive ink composition. In one embodiment, the conductive ink composition has a concentration of about 1 to about 10 wt. % silver of the conductive ink composition. In one embodiment, the conductive ink composition has a concentration of about 5 to about 15 wt. % silver of the conductive ink composition. In some embodiments, the conductive ink composition has a concentration of about 1 wt. %, about 2 wt. %, about 3 wt. %, about 4 wt. %, about 5 wt. %, about 6 wt. %, about 7 wt. %, about 8 wt. %, about 9 wt. %, about 10 wt. %, about 11 wt. %, about 12 wt. %, about 13 wt. %, about 14 wt. %, about 15 wt. %, about 16 wt. %, about 17 wt. %, about 18 wt. %, about 19 wt. %, about 20 wt. %, about 21 wt. %, about 22 wt. %, about 23 wt. %, about 24 wt. %, about 25 wt. %, about 26 wt. %, about 27 wt. %, about 28 wt. %, about 29 wt. %, about 30 wt. %, about 31 wt. %, about 32 wt. %, about 33 wt. %, about 34 wt. %, about 35 wt. %, about 36 wt. %, about 37 wt. %, about 38 wt. %, about 39 wt. %, or about 40 wt. % silver of the conductive ink composition.

In one embodiment, the conductive structure has a low root mean square (RMS) value. In one embodiment, the conductive structure has a RMS value of less than about 20 nm. In one embodiment, the conductive structure has a RMS value of less than about 10 nm.

In one embodiment, the electrical conductivity of the conductive structures is measured. In one embodiment, the electrical conductivity of the conductive structures is from about $2 \times 10^{-6}$ Ohm-cm to about $1 \times 10^{-5}$ Ohm-cm. In one embodiment, the electrical conductivity of the conductive structures is from about $3 \times 10^{-6}$ Ohm-cm to about $6 \times 10^{-6}$ Ohm-cm. In some embodiments, the electrical conductivity of the conductive structures is at least about $2 \times 10^{-6}$ Ohm-cm, about $3 \times 10^{-6}$ Ohm-cm, about $4 \times 10^{-6}$ Ohm-cm, about $5 \times 10^{-6}$ Ohm-cm, about $6 \times 10^{-6}$ Ohm-cm, about $7 \times 10^{-6}$ Ohm-cm, about $8 \times 10^{-6}$ Ohm-cm, or about $9 \times 10^{-6}$ Ohm-cm. In some embodiments, the electrical conductivity of the conductive structures is at most about $1 \times 10^{-5}$ Ohm-cm, about $9 \times 10^{-6}$ Ohm-cm, about $8 \times 10^{-6}$ Ohm-cm, about $7 \times 10^{-6}$ Ohm-cm, about $6 \times 10^{-6}$ Ohm-cm, about $5 \times 10^{-6}$ Ohm-cm, about $4 \times 10^{-6}$ Ohm-cm, or about $3 \times 10^{-6}$ Ohm-cm.

Combinations of Silver Neodecanoate, Xylene, and 2-Ethylhexylamine

In one embodiment, a conductive ink composition includes a silver complex formed by mixing silver neodecanoate dissolved in xylene, with 2-ethylhexylamine. The 2-ethylhexylamine decarboxylates the silver neodecanoate at a temperature of approximately 100° C. or less. In another embodiment, the 2-ethylhexylamine decarboxylates the silver neodecanoate at a temperature of approximately 190° C. or less.

In one embodiment, a conductive ink composition includes a silver complex formed by mixing about 0.5 grams silver neodecanoate dissolved in about 1 mL xylene, with about 0.2 mL 2-ethyhexylamine. The 2-ethylhexylamine decarboxylates the silver neodecanoate at a temperature of about 100° C. or less. In some embodiments, the 2-ethylhexylamine decarboxylates the silver neodecanoate at a temperature of about 95° C. or less or of about 105° C. or less.

In one embodiment, a conductive ink composition includes a silver complex formed by mixing silver neodecanoate dissolved in xylene, with 2-ethylhexylamine. The 2-ethylhexylamine decarboxylates the silver neodecanoate at a temperature of approximately 100° C. or less. In some embodiments, a conductive ink composition includes a silver complex formed by mixing about 0.5 grams silver neodecanoate dissolved in about 1 mL xylene, with about 0.4 mL or about 0.6 mL 2-ethyhexylamine. The 2-ethylhexylamine decarboxylates the silver neodecanoate at a temperature of approximately 100° C. or less.

In one embodiment, a conductive ink composition includes a silver complex formed by mixing silver neodecanoate dissolved in xylene, with 2-ethylhexylamine. The 2-ethylhexylamine decarboxylates the silver neodecanoate at a temperature of approximately 100° C. or less. In one embodiment, a conductive ink composition includes a silver complex formed by mixing about 0.4 grams or about 0.6 grams silver neodecanoate dissolved in about 1 mL xylene, with about 0.2 mL 2-ethyhexylamine. The 2-ethylhexylamine decarboxylates the silver neodecanoate at a temperature of approximately 100° C. or less.

Combinations of Silver Hexafluoroacetylacetonate, Xylene, and Tert-Octylamine

In one embodiment, a conductive ink composition includes a silver complex formed by mixing silver hexafluoroacetylacetonate dissolved in xylene, with tert-octylamine. The tert-octylamine decarboxylates the silver hexafluoroacetylacetonate at a temperature of approximately 100° C. or less. In another embodiment, the tert-octylamine decarboxylates the silver hexafluoroacetylacetonate at a temperature of approximately 160° C. or less In one embodiment, a conductive ink composition includes a silver complex formed by mixing about 0.4 grams silver hexafluoroacetylacetonate dissolved in about 1 mL xylene, with about 0.2 mL tert-octylamine. The tert-octylamine decarboxylates the silver neodecanoate at a temperature of about 100° C. or less. In some embodiments, the tert-octylamine decarboxylates the silver neodecanoate at a temperature of about 95° C. or less or at a temperature of about 105° C. or less.

In one embodiment, a conductive ink composition includes a silver complex formed by mixing silver hexafluoroacetylacetonate dissolved in xylene, with tert-octylamine. The tert-octylamine decarboxylates the silver hexafluoroacetylacetonate at a temperature of approximately 100° C. or less. In some embodiments, a conductive ink composition includes a silver complex formed by mixing about 0.4 grams silver hexafluoroacetylacetonate dissolved in about 1 mL xylene, with about 0.4 mL or about 0.6 mL tert-octylamine. The tert-octylamine decarboxylates the silver neodecanoate at a temperature of approximately 100° C. or less.

In one embodiment, a conductive ink composition includes a silver complex formed by mixing silver hexafluoroacetylacetonate dissolved in xylene, with tert-octylamine. The tert-octylamine decarboxylates the silver hexafluoroacetylacetonate at a temperature of approximately 100° C. or less. In some embodiments, a conductive ink composition includes a silver complex formed by mixing about 0.3 grams or about 0.5 grams silver hexafluoroacetylacetonate dissolved in about 1 mL xylene, with about 0.2 mL tert-octylamine. The tert-octylamine decarboxylates the silver neodecanoate at a temperature of approximately 100° C. or less.

Combinations of Silver Neodecanoate, Xylene, Terpineol, and Tert-Octylamine

In one embodiment, a conductive ink composition includes a silver complex formed by mixing silver neodecanoate dissolved in xylene and terpineol, with tert-octylamine. The tert-octylamine decarboxylates the silver neodecanoate at a temperature of approximately 100° C. or less. In another embodiment, the tert-octylamine decarboxylates the silver neodecanoate at a temperature of approximately 200° C. or less.

In one embodiment, a conductive ink composition includes a silver complex formed by mixing about 0.5 grams silver neodecanoate dissolved in a mixture of about 0.5 mL xylene and about 0.5 mL terpineol, with about 0.2 mL tert-octylamine. The tert-octylamine decarboxylates the silver neodecanoate at a temperature of about 100° C. or less. In some embodiments, the tert-octylamine decarboxylates the silver neodecanoate at a temperature of about 80° C. or less, at a temperature of about 90° C. or less, or at a temperature of about 110° C. or less.

In one embodiment, a conductive ink composition includes a silver complex formed by mixing silver neodecanoate dissolved in xylene and terpineol, with tert-octylamine. The tert-octylamine decarboxylates the silver neodecanoate at a temperature of approximately 100° C. or less. In some embodiments, a conductive ink composition includes a silver complex formed by mixing about 0.5 grams silver neodecanoate dissolved in a mixture of about 0.5 mL xylene and about 0.5 mL terpineol, with about 0.4 mL or about 0.6 mL tert-octylamine. The tert-octylamine decarboxylates the silver neodecanoate at a temperature of approximately 100° C. or less.

In one embodiment, a conductive ink composition includes a silver complex formed by mixing silver neodecanoate dissolved in xylene and terpineol, with tert-octylamine. The tert-octylamine decarboxylates the silver neodecanoate at a temperature of approximately 100° C. or less. In some embodiments, a conductive ink composition includes a silver complex formed by mixing about 0.4 grams or about 0.6 grams silver neodecanoate dissolved in a mixture of about 0.5 mL xylene and about 0.5 mL terpineol, with about 0.2 mL tert-octylamine. The tert-octylamine decarboxylates the silver neodecanoate at a temperature of approximately 100° C. or less.

In one embodiment, a conductive ink composition includes a silver complex formed by mixing silver neodecanoate dissolved in xylene and terpineol, with tert-octylamine. The tert-octylamine decarboxylates the silver neodecanoate at a temperature of approximately 100° C. or less. In one embodiment, a conductive ink composition includes a silver complex formed by mixing about 0.5 grams silver neodecanoate dissolved in a mixture of about 0.6 mL xylene and about 0.4 mL terpineol, with about 0.2 mL tert-octylamine. The tert-octylamine decarboxylates the silver neodecanoate at a temperature of approximately 100° C. or less.

In one embodiment, a conductive ink composition includes a silver complex formed by mixing silver neodecanoate dissolved in xylene and terpineol, with tert-octylamine. The tert-octylamine decarboxylates the silver neodecanoate at a temperature of approximately 100° C. or less. In one embodiment, a conductive ink composition includes a silver complex formed by mixing about 0.5 grams silver neodecanoate dissolved in a mixture of about 0.7 mL xylene and about 0.3 mL terpineol, with about 0.2 mL tert-octylamine. The tert-octylamine decarboxylates the silver neodecanoate at a temperature of approximately 100° C. or less.

In one embodiment, a conductive ink composition includes a silver complex formed by mixing silver neodecanoate dissolved in xylene and terpineol, with tert-octylamine. The tert-octylamine decarboxylates the silver neodecanoate at a temperature of approximately 100° C. or less. In one embodiment, a conductive ink composition includes a silver complex formed by mixing about 0.5 grams silver neodecanoate dissolved in a mixture of about 0.8 mL xylene and about 0.2 mL terpineol, with about 0.2 mL tert-octylamine. The tert-octylamine decarboxylates the silver neodecanoate at a temperature of approximately 100° C. or less.

In one embodiment, a conductive ink composition includes a silver complex formed by mixing silver neodecanoate dissolved in xylene and terpineol, with tert-octylamine. The tert-octylamine decarboxylates the silver neodecanoate at a temperature of approximately 100° C. or less. In one embodiment, a conductive ink composition includes a silver complex formed by mixing about 0.5 grams silver neodecanoate dissolved in a mixture of about 0.4 mL xylene and about 0.6 mL terpineol, with about 0.2 mL tert-octylamine. The tert-octylamine decarboxylates the silver neodecanoate at a temperature of approximately 100° C. or less.

In one embodiment, a conductive ink composition includes a silver complex formed by mixing silver neodecanoate dissolved in xylene and terpineol, with tert-octylamine. The tert-octylamine decarboxylates the silver neodecanoate at a temperature of approximately 100° C. or less. In one embodiment, a conductive ink composition includes a silver complex formed by mixing about 0.5 grams silver neodecanoate dissolved in a mixture of about 0.3 mL xylene and about 0.7 mL terpineol, with about 0.2 mL tert-octylamine. The tert-octylamine decarboxylates the silver neodecanoate at a temperature of approximately 100° C. or less.

In one embodiment, a conductive ink composition includes a silver complex formed by mixing silver neodecanoate dissolved in xylene and terpineol, with tert-octylamine. The tert-octylamine decarboxylates the silver neodecanoate at a temperature of approximately 100° C. or less. In one embodiment, a conductive ink composition includes a silver complex formed by mixing about 0.5 grams silver neodecanoate dissolved in a mixture of about 0.2 mL xylene and about 0.8 mL terpineol, with about 0.2 mL tert-octylamine. The tert-octylamine decarboxylates the silver neodecanoate at a temperature of approximately 100° C. or less.

Methods for Making Conductive Ink Compositions

In one aspect, a method of making a conductive structure is disclosed. In one embodiment, the method includes the step of mixing a silver carboxylate in the presence of a catalyst comprising an amine to form a silver complex. The silver carboxylate is dissolved in at least one dissolving agent. In one embodiment, the method also includes the step of applying the silver complex to a substrate. In some embodiment, the method includes the step of heating the silver complex on the substrate at a decomposition temperature of about 200° C. or less to form the conductive structure. In some embodiment, the method includes the step of heating the silver complex on the substrate at a decomposition temperature of about 100° C. or less to form the conductive structure. In some embodiments, the method includes the step of heating the silver complex on the substrate at a decomposition temperature of about 210° C. or less, of about 220° C. or less, of about 190° C., of about 180° C. or less, of about 170° C. or less, of about 160° C., of about 150° C. or less, of about 140° C. or less, of about 130° C. or less, of about 120° C. or less, of about 110° C. or less, of about 90° C. or less, of about 80° C. or less, of about 70° C. or less, of about 60° C. or less, or of about 50° C. or less to form the conductive structure. In one embodiment, the silver complex is heated with a heat source. Examples of heat sources include an IR lamp, oven, or a heated substrate.

In one embodiment, the silver carboxylate is dissolved in the dissolving agent prior to adding the catalyst. In one embodiment, the silver carboxylate is mixed with the catalyst prior to dissolving the silver carboxylate in the dissolving agent. In one embodiment, the silver carboxylate, dissolving agent, and catalyst are added simultaneously.

In one embodiment, the silver complex has a desired viscosity. In one embodiment, the desired viscosity is obtained using a microVISC viscometer. In one embodiment, the silver complex has a viscosity from about 50 centipoise to about 1000 centipoise. In one embodiment, the silver complex has a viscosity from about 5 centipoise to about 50 centipoise. In one embodiment, the silver complex has a viscosity from about 10 centipoise to about 40 centipoise. In one embodiment, the silver complex has a viscosity from about 20 centipoise to about 30 centipoise. In one embodiment, the silver complex has a viscosity from about 18 centipoise to about 20 centipoise. In some embodiments, the silver complex has a viscosity of about 18, about 19, or about 20 centipoise. In some embodiments, the silver complex has a viscosity of at least about 5 centipoise, about 10 centipoise, about 20 centipoise, about 30 centipoise, about 40 centipoise, about 50 centipoise, about 60 centipoise, about 70 centipoise, about 80 centipoise, about 90 centipoise, about 100 centipoise, about 200 centipoise, about 300 centipoise, about 400 centipoise, about 500 centipoise, about 600 centipoise, about 700 centipoise, about 800 centipoise, or about 900 centipoise. In some embodiments, the silver complex has a viscosity of at most about 1000 centipoise, about 900 centipoise, about 800 centipoise, about 700 centipoise, about 600 centipoise, about 500 centipoise, about 400 centipoise, about 300 centipoise, about 200 centipoise, about 100 centipoise, about 90 centipoise, about 80 centipoise, about 70 centipoise, about 60 centipoise, about 50 centipoise, about 40 centipoise, about 30 centipoise, about 20 centipoise, or about 10 centipoise.

In one embodiment, the viscosity of the complex is adjusted based upon the amount of solvent used. In one embodiment, the viscosity of the complex is adjusted based upon the type of solvent used. In one embodiment where the dissolving agent comprises terpineol and xylene, if more terpineol is used and less xylene, the viscosity increases. In one embodiment, the viscosity of silver complex can be tuned from 5 centipoise with a large proportion of xylene to 50 centipoise with a large portion of terpineol.

Further, the viscosity of the complex is adjusted based upon the amount of catalyst that is added. If more catalyst is used, the viscosity of the silver complex increases. In one embodiment, the viscosity of the silver complex can be increased to well over 1000 centipoise by increasing the amount of catalyst. In one embodiment, the viscosity of the silver complex can be increased to well over 1000 centipoise by increasing the amount of catalyst from about 0.2 mL to about 0.6 mL. In one embodiment, if less catalyst is used, the viscosity of the silver complex decreases.

Applications of the Conductive Ink Compositions

The conductive ink compositions can be used in various printing applications, including slot die coating, spin coating, roll-to-roll printing, including gravure, flexography, rotary screen printing, screen printing, aerosol jet printing, inkjet printing, airbrushing, Mayer rod coating, flood coating, 3D printing, dispenser, and electrohydrodynamic printing. Furthermore, patterns can be created using photolithography to create a mask to etch silver from certain areas, thereby creating high-fidelity features. Both positive and negative patterning processes may be used to create the patterns.

In one embodiment, the silver salt of the silver carboxylate is completely dissolved in at least one dissolving agent. The fully dissolved silver salt is compatible with many nonpolar polymer substrates, glasses, and ceramic substrates where polar complexes do not wet particularly well. In one embodiment, the silver complex is applied to a polymer substrate. In one embodiment, the silver complex is applied to a nonpolar polymer substrate. In one embodiment, the silver complex is applied to a glass substrate. In one embodiment, the silver complex is applied to a ceramic substrate.

Furthermore, elastomers and 3D substrates with specifically non-planar topography can be used in conjunction with the conductive structures. In one embodiment, the silver complex is applied to an elastomer. In one embodiment, the silver complex is applied to a 3D substrate.

The specular reflectance of the conductive structure is a by-product of the extremely low RMS values of the conductive structure. In one embodiment, the RMS value of the conductive structure is about 10 nanometers or less. In one embodiment, the conductive structure is used on substrates with smooth surfaces. In one embodiment, the conductive structure is used for electrode structures for OLED displays and photovoltaics. The structures are also used as conductive traces and electrodes in displays and touchscreen, as well as printed antenna.

Ink Composition

Definitions

When describing the compounds, compositions, methods and processes of this disclosure, the following terms have the following meanings, unless otherwise indicated.

The term "alkyl" means a hydrocarbon group that may be linear, cyclic, or branched or a combination thereof having the number of carbon atoms designated (i.e., $C_{1-30}$ means one to thirty carbon atoms). Examples of alkyl groups include methyl, ethyl, n-propyl, isopropyl, n-butyl, t-butyl, isobutyl, sec-butyl, cyclohexyl, cyclopentyl, (cyclohexyl) methyl, cyclopropylmethyl, bicyclo[2.2.1]heptane, bicyclo[2.2.2]octane, etc. Alkyl groups can be substituted or unsubstituted, unless otherwise indicated.

The term "cycloalkyl" refers to saturated monocyclic, bicyclic, tricyclic, or other polycyclic hydrocarbon groups. Any atom can be substituted, e.g., by one or more substituents. A ring carbon serves as the point of attachment of a cycloalkyl group to another moiety. Cycloalkyl groups can contain fused rings. Fused rings are rings that share a common carbon atom. Cycloalkyl moieties can include, e.g., cyclopropyl, cyclobutyl, cyclopentyl, cyclohexyl, cycloheptyl, adamantyl, and norbornyl (bicycle[2.2.1]heptyl).

The term "bulky" means that the size of a group can produce steric hindrance. A "sterically bulky counter ion" is a counter ion that can produce a steric hindrance.

The term "ligand" refers to a compound that can form one or more bonds to a single metal ion. Examples of ligands are amines, ethers and thioethers.

Compositions

This disclosure also relates generally to an ink composition comprising a metallic salt with a sterically bulky counter ion and a ligand.

Any suitable metallic salts with a sterically bulky counter ion can be used. In some embodiments, the metallic salt is selected from the group consisting of silver, copper, nickel, gold, platinum, palladium, aluminum, magnesium, zinc, and tin salts. In one embodiment, the salt is a silver salt.

In some embodiments, the sterically bulky counter ions are selected from the group consisting of carboxylate, cyanide, sulfonate, borate, phosphate, and perchlorate. In some embodiments, the sterically bulky counter ions are long chain or branched carboxylates. In some embodiments, the sterically bulky counter ions are $R^1COO^-$. $R^1$ is selected from the group consisting of unsubstituted or substituted alkyl, unsubstituted or substituted cycloalkyl, and unsubstituted or substituted heterocycloalkyl. In some embodiments, $R^1$ is substituted $C_1-C_{30}$ alkyl. In some embodiments, the $C_1-C_{30}$ alkyl can be substituted with at least one of alkyl and keto groups. The substituent selected is preferably sufficiently large to provide the steric hindrance characteristic to the sterically bulky counter ion. In some embodiments, the sterically bulky counter ions are neodecanoate, 2-ethyloctanoate, 2-ethylhexanoate, 2-ethylpentanoate, 2-ethylbutylnoate, 2-ethyl-2-methylbutanoate, 2,2-diethylbutanoate, and combinations thereof. In one embodiment, the sterically bulky counter ion is neodecanoate. In other embodiments, the sterically bulky counter ions are beta ketocarboxylates, for example, 3-oxobutanoate, 3-oxopentanoate, or 3-oxohexanoate.

In other embodiments, the sterically bulky counter ions are tetrafluoroborate ($[BF_4]^-$), hexafluorophosphate ($[PF_6]^-$), or perchlorate.

In some embodiments, the metallic salt with a sterically bulky counter ion is silver neodecanoate, silver 2-ethylhexanoate, or silver beta ketocarboxylates. In one embodiment, the salt is silver neodecanoate.

The ligand can be any suitable ligands. In general, the ligand has a relatively low boiling point (less than 200° C.). When the temperature is increased to higher than 100° C., the ligand starts to evaporate. As a result, the inks have a low annealing temperature while maintaining a high viscosity without the need for particles or polymers to increase the viscosity.

In some embodiments, the ligand is a bulky ligand. In some embodiments, the ligand is selected from the group consisting of primary amines, secondary amines, tertiary amines, and cyclic amines. In some embodiments, the ligand is selected from the group consisting of tert-butylamine, 2-methylbutan-2-amine, 2-methylpentan-2-amine, 2-ethylhexylamine, 2-ethylheptylamine, N-ethylhexan-1-amine, N-ethylheptan-1-amine, and tert-octylamine. In one embodiment, the ligand is tert-octylamine. In some embodiments, the ligand is unsubstituted or substituted pyrrolidine, and unsubstituted or substituted piperidine.

In some embodiments, the ligand is selected from the group consisting of thioethers, cyclic thioethers, ethers, crown ethers, and combinations thereof. In some embodiments, the ligand is selected from the group consisting of branched thioethers, and branched ethers. For example, the ligand can be of formula R'XR". R' and R" is independently a long chain or branched alkyl. X is S or O.

In some embodiments, the molar ratio of the ligand to the metallic salt is between about 10,000:1 and about 50:1. In some embodiments, the molar ratio of the ligand to the metallic salt is larger than about 30:1. In some embodiments, the molar ratio of the ligand to the metallic salt is larger than about 15:1. In some embodiments, the molar ratio of the ligand to the metallic salt is larger than about 10:1. In some embodiments, the molar ratio of the metal salt to the ligand is about 1.

The ink composition can further comprise a solvent. In general, the solvent has low boiling points. In some embodiments, the solvent is a polar solvent, such as water and dimethylformamide. In some embodiments, xylene is used as a solvent.

Preparations

The present disclosure also provides a method of preparing an ink composition. The method comprises adding a metallic salt with a sterically bulky counter ion in a solvent to form a mixture; and adding a ligand to the mixture to form an ink composition.

When the metallic salt is dissolved in the solvent, the mixture has a relatively low viscosity and flows freely. Once the metallic salt is added, the viscosity increases rapidly. After addition of ligand, the viscosity reaches about 100 cPs. The viscosity will continue increasing to reach about 10000 cPs when more ligands are added. Without wishing to be bound by theory, the bulky counter ions of the metallic salt create a significant amount of steric hindrance for the metallic ion when it is dissolved in an appropriate solvent. The association of the hindrance with the bulky ligand creates a fully gelled mixture. The fully gelled mixture has a large viscosity and does not flow freely. In one embodiment, the mixture does not flow even when a container filled with the mixture is turned upside down.

In the present disclosure, the metallic salt is selected from the group consisting of silver, copper, nickel, gold, platinum, palladium, aluminum, magnesium, zinc, and tin salts. In one embodiment, the salt is a silver salt.

In some embodiments, the sterically bulky counter ions are selected from the group consisting of carboxylate, cyanide, sulfonate, borate, phosphate, and perchlorate. In some embodiments, the sterically bulky counter ions are long chain or branched carboxylates. In some embodiments, the sterically bulky counter ions are $R^1COO^-$. $R^1$ is selected from the group consisting of unsubstituted or substituted alkyl, unsubstituted or substituted cycloalkyl, and unsubstituted or substituted heterocycloalkyl. In some embodiments, $R^1$ is substituted $C_1$-$C_{30}$ alkyl. In some embodiments, the $C_1$-$C_{30}$ alkyl is substituted with at least one of alkyl and keto groups. The substituent selected is preferably sufficiently large to provide the steric hindrance characteristic to the sterically bulky counter ion.

In some embodiments, the sterically bulky counter ions are neodecanoate, 2-ethyloctanoate, 2-ethylhexanoate, 2-ethylpentanoate, 2-ethylbutylnoate, 2-ethyl-2-methylbutanoate, 2,2-diethylbutanoate, and combinations thereof. In one embodiment, the sterically bulky counter ion is neodecanoate. In other embodiments, the sterically bulky counter ions are beta ketocarboxylates, for example, 3-oxobutanoate, 3-oxopentanoate, or 3-oxohexanoate.

In other embodiments, the sterically bulky counter ions are tetrafluoroborate ($[BF_4]^-$), hexafluorophosphate ($[PF_6]^-$), or perchlorate.

In some embodiments, the metallic salt with a sterically bulky counter ion is silver neodecanoate, silver 2-ethylhexanoate, or silver beta ketocarboxylates. In one embodiment, the salt is silver neodecanoate.

The ligand can be any suitable ligands. In some embodiments, the ligand is a bulky ligand. In some embodiments, the ligand is selected from the group consisting of primary amines, secondary amines, tertiary amines, and cyclic amines.

In some embodiments, the ligand is selected from the group consisting of tert-butylamine, 2-methylbutan-2-amine, 2-methylpentan-2-amine, 2-ethylhexylamine, 2-ethylheptylamine, N-ethylhexan-1-amine, N-ethylheptan-1-amine, and tert-octylamine. In one embodiment, the ligand is tert-octylamine. In some embodiments, the ligand is unsubstituted or substituted pyrrolidine, and unsubstituted or substituted piperidine.

In some embodiments, the ligand is selected from the group consisting of thioethers, cyclic thioethers, ethers, crown ethers, and combinations thereof. In some embodiments, the ligand is selected from the group consisting of branched thioethers, and branched ethers. For example, the ligand can be of formula R'XR". R' and R" is independently long chain or branched alkyl. X is S or O.

In some embodiments, the molar ratio of the ligand to the metallic salt is between about 10,000:1 and about 50:1. In some embodiments, the molar ratio of the ligand to the metallic salt is larger than about 30:1. In some embodiments, the molar ratio of the ligand to the metallic salt is larger than about 15:1. In some embodiments, the molar ratio of the ligand to the metallic salt is larger than about 10:1. In some embodiments, the molar ratio of the metal salt to the ligand is about 1:1.

The solvent can be any suitable solvent. In general, the solvent has low boiling points. In some embodiments, the solvent is a polar solvent, such as water and dimethylformamide. In some embodiments, xylene is used as a solvent. In some embodiments, the ligand can act as a solvent.

Applications

A method of making a conductive structure is disclosed. The method comprises adding a metallic salt with a sterically bulky counter ion in a solvent to form a first mixture; adding a ligand to the first mixture to form an ink composition; and heating the ink composition to form a conductive structure. In some embodiments, the method comprises a step of depositing the ink composition onto a substrate. The substrates include glass, cellulose acetate, cellophane, polyimide, and polyethylene terephthalate (PET) film, ITO. PC, CPO.

Reactive Metal Complexes and their Alloys

Compositions and methods of making the compositions to provide a conductive ink structure are also disclosed. The improved ink compositions are formed by making reducible metal complexes that do not require high decomposition temperatures. By employing lower decomposition temperatures to form the conductive structures, the improved ink compositions are compatible with more substrates that do not require high processing temperatures to maintain integrity. Further, the method for making the ink compositions is both simple and high-yielding. The ink compositions may possess low viscosity so that it is compatible with a broad range of patterning techniques, including slot die coating, spin coating, roll-to-roll printing, including gravure, flexography, rotary screen printing, screen-printing, aerosol jet printing, inkjet printing, airbrushing, Mayer rod coating, flood coating, 3D printing, and electrohydrodynamic printing. The patterned features may be highly conductive at room temperature and achieve bulk conductivity upon decomposing at mild temperatures (e.g., less than about 100° C.). Finally, the ink may remain stable at room temperature for months without particle precipitation.

Some systems and methods have disclosed reducing agents that reduce metal salts on a substrate to form metallic ink formulations. U.S. Pat. No. 8,066,805, hereby incorporated by reference in its entirety, describes printable metal formulations, methods of making the formulations, and methods of coating or printing thin films from metal ink precursors, where the metal formulations include one or more Group 4, 5, 6, 7, 8, 9, 10, 11, or 12 metal salts or metal complexes. U.S. Patent Application No. 2005/0006339, hereby incorporated by reference in its entirety, describes methods and systems for depositing metal patterns and reducing metal salts on a substrate.

Compositions and methods of making the compositions to provide a conductive ink structure are disclosed. An ink composition (also referred to as a "conductive ink" or an "ink") has been created for printing highly conductive features at room temperature. Such inks may be stable, particle-free, and suitable for a wide range of patterning techniques.

In one aspect, an ink composition includes a reducible metal complex formed by mixing a reducing agent dissolved in a dissolving agent, with at least one metal salt or metal complex. The reducing agent is soluble in the dissolving agent. Solubility, as known to one of ordinary skill, is the property of a substance, such as a reducing agent, to dissolve in a solvent, such as a dissolving agent. In one embodiment, the reducing agent is a hydride. In some embodiments, the reducing agent is either a formate or a beta ketocarboxylate. In one embodiment, the reducing agent reduces the metal of the metal salt or metal complex to form a conductive structure. In one embodiment, a precipitate forms upon mixing the reducing agent with the at least one metal salt or metal complex. In one embodiment, the precipitate is removed prior to applying the reducible metal complex to a substrate. In one embodiment, the precipitate is removed prior to decomposing the reducible metal complex on the substrate.

In one aspect, an ink composition for making a conductive structure includes a reducible metal complex formed by mixing a reducing agent dissolved in a dissolving agent, with at least one metal salt or metal complex. The metal of the metal salt or metal complex is a Group 4, 5, 6, 7, 8, 9, 10, 11, or 12 metal. In one embodiment, the reducing agent is a hydride. In some embodiments, the reducing agent is either a formate or a beta ketocarboxylate. The reducing agent reduces the metal of the metal salt or metal complex to form a conductive structure.

Metals and Metal Complexes

In one embodiment, the metal salt has a formula $MX_n$. In one embodiment, the metal complex has a formula $M(L)_pX_n$. In one embodiment, M is a Group 4, 5, 6, 7, 8, 9, 10, 11, or 12 metal. In one embodiment, X is a halide, pseudohalide, nitrate, sulfate, formate, acetate, cyanate, isocyanate, alkoxide, or a diketonate. In one embodiment, L is selected from the group consisting of $NH_3$, CO, NO, $N_2$, $H_2S$, $C_2H_4$, $C_6H_6$, CN, NC, $PH_3$. In one embodiment, n is equal to a formal charge of M divided by a formal charge of X. In one embodiment, p is an integer equal to a number of coordination sites on M, minus the coordination sites occupied by $X_n$. In one embodiment, $M(L)_pX_n$ comprises nickel tetracarbonyl. In one embodiment, $M(L)_pX_n$ comprises cobalt tetracarbonyl.

In one embodiment, M is selected from the group consisting of: aluminum, magnesium, titanium, silicon, vanadium, zinc, tin, copper, nickel, palladium, zirconium, iron, niobium, germanium, manganese, chromium, cobalt, tungsten, molybdenum, bismuth, ruthenium, and combinations thereof.

In one embodiment, the metal complex comprises a silicon alkyl complex. In one embodiment, the metal complex is selected from the group consisting of tetramethylsilane, tetraethylsilane, 1,2-dichlorotetramethylsilane, 1,2-diphenyltetramethylsilane, 1,2-dichlorotetraethyl silane, 1,2-diphenyltetraethylsilane, 1,2,3-trichlorotetramethylsilane, or 1,2,3-tetramethyltriphenylsilane. In one embodiment, the metal complex comprises tetraethylsilane.

In one embodiment, the ligand L is either an alkene or an alkyne. In one embodiment, the ligand L is selected from the group consisting of cyclooctadiene, norbornadiene, and ethylene. In one embodiment, the metal complex comprises a metal alkene complex. In one embodiment, the metal complex comprises a nickel (0) alkene complex. In one embodiment, the metal complex comprises bis(cyclooctadiene) nickel (0). In one embodiment, the metal complex comprises tris(ethylene)nickel (0). In one embodiment, the metal complex comprises a metal alkyne complex. In one embodiment, the metal complex comprises a platinum (0) alkyne complex.

In one embodiment, the ink composition has a concentration of about 0.1-40 wt. % metal salt of the ink composition. In one embodiment, the ink composition has a concentration of about 1-30 wt. % metal salt of the ink composition. In one embodiment, the ink composition has a concentration of about 1-20 wt. % metal salt of the ink composition. In one embodiment, the ink composition has a concentration of about 1-10 wt. % metal salt of the ink composition. In one embodiment, the ink composition has a concentration of about 5-15 wt. % metal salt of the ink composition. In some embodiments, the ink composition has a concentration of about 0.1 wt. %, about 0.2 wt. %, about 0.3 wt. %, about 0.4 wt. %, about 0.5 wt. %, about 0.6 wt. %, about 0.7 wt. %, about 0.8 wt. %, about 0.9 wt. %, about 1 wt. %, about 2 wt. %, about 3 wt. %, about 4 wt. %, about 5 wt. %, about 6 wt. %, about 7 wt. %, about 8 wt. %, about 9 wt. %, about 10 wt. %, about 11 wt. %, about 12 wt. %, about 13 wt. %, about 14 wt. %, about 15 wt. %, about 16 wt. %, about 17 wt. %, about 18 wt. %, about 19 wt. %, or about 20 wt. % metal of the ink composition.

In some embodiments, the ink composition has a concentration of at least about 0.1 wt. %, about 0.2 wt. %, about 0.3 wt. %, about 0.4 wt. %, about 0.5 wt. %, about 0.6 wt. %, about 0.7 wt. %, about 0.8 wt. %, about 0.9 wt. %, 1 wt. %, about 2 wt. %, about 3 wt. %, about 4 wt. %, about 5 wt. %, about 6 wt. %, about 7 wt. %, about 8 wt. %, about 9 wt. %, about 10 wt. %, about 11 wt. %, about 12 wt. %, about 13 wt. %, about 14 wt. %, about 15 wt. %, about 16 wt. %, about 17 wt. %, about 18 wt. %, about 19 wt. %, or about 20 wt. % metal salt of the ink composition. In some embodiments, the ink composition has a concentration of at most about 40 wt. %, about 39 wt. %, about 38 wt. %, about 37 wt. %, about 36 wt. %, about 35 wt. %, about 34 wt. %, about 33 wt. %, about 32 wt. %, 31 wt. %, about 30 wt. %, about 29 wt. %, about 28 wt. %, about 27 wt. %, about 26 wt. %, about 25 wt. %, about 24 wt. %, about 23 wt. %, about 22 wt. %, about 21 wt. %, about 20 wt. %, about 19 wt. %, about 18 wt. %, about 17 wt. %, about 16 wt. %, about 15 wt. %, about 14 wt. %, about 13 wt. %, or about 12 wt. % metal salt of the ink composition.

In one embodiment, the ink composition has a concentration of about 0.1-40 wt. % metal complex of the ink composition. In one embodiment, the ink composition has a concentration of about 1-30 wt. % metal complex of the ink composition. In one embodiment, the ink composition has a concentration of about 1-20 wt. % metal complex of the ink composition. In one embodiment, the ink composition has a concentration of about 1-10 wt. % metal complex of the ink composition. In one embodiment, the ink composition has a concentration of about 5-15 wt. % metal complex of the ink composition. In some embodiments, the ink composition has a concentration of about 0.1 wt. %, about 0.2 wt. %, about 0.3 wt. %, about 0.4 wt. %, about 0.5 wt. %, about 0.6 wt.

%, about 0.7 wt. %, about 0.8 wt. %, about 0.9 wt. %, 1 wt. %, about 2 wt. %, about 3 wt. %, about 4 wt. %, about 5 wt. %, about 6 wt. %, about 7 wt. %, about 8 wt. %, about 9 wt. %, about 10 wt. %, about 11 wt. %, about 12 wt. %, about 13 wt. %, about 14 wt. %, about 15 wt. %, about 16 wt. %, about 17 wt. %, about 18 wt. %, about 19 wt. %, or about 20 wt. % metal complex of the ink composition.

In some embodiments, the ink composition has a concentration of at least about 0.1 wt. %, about 0.2 wt. %, about 0.3 wt. %, about 0.4 wt. %, about 0.5 wt. %, about 0.6 wt. %, about 0.7 wt. %, about 0.8 wt. %, about 0.9 wt. %, 1 wt. %, about 2 wt. %, about 3 wt. %, about 4 wt. %, about 5 wt. %, about 6 wt. %, about 7 wt. %, about 8 wt. %, about 9 wt. %, about 10 wt. %, about 11 wt. %, about 12 wt. %, about 13 wt. %, about 14 wt. %, about 15 wt. %, about 16 wt. %, about 17 wt. %, about 18 wt. %, about 19 wt. %, or about 20 wt. % metal complex of the ink composition. In some embodiments, the ink composition has a concentration of at most about 40 wt. %, about 39 wt. %, about 38 wt. %, about 37 wt. %, about 36 wt. %, about 35 wt. %, about 34 wt. %, about 33 wt. %, about 32 wt. %, 31 wt. %, about 30 wt. %, about 29 wt. %, about 28 wt. %, about 27 wt. %, about 26 wt. %, about 25 wt. %, about 24 wt. %, about 23 wt. %, about 22 wt. %, about 21 wt. %, about 20 wt. %, about 19 wt. %, about 18 wt. %, about 17 wt. %, about 16 wt. %, about 15 wt. %, about 14 wt. %, about 13 wt. %, or about 12 wt. % metal complex of the ink composition.

Dissolving Agents

As mentioned above, at least one dissolving agent dissolves the disclosed reducing agents. The dissolving agent acts as a stabilizer and a solvent for the reducing agent. The dissolving agent is not intended to act as a reducing agent for the metal salts of the metal and metal complexes. In one embodiment, the dissolving agent has a boiling point of about 200° C. or less. In one embodiment, the dissolving agent may be selected based on the type of reducing agent used to make the ink composition. In one embodiment, the dissolving agent may be selected based on the boiling point for a specific application of the ink composition. In one embodiment, the dissolving agent may be selected based on the type of substrate the ink composition will be applied to. For deposition methods such as inkjet printing or e-jet, greater stability is generally preferred, and thus it may be preferable to use a dissolving agent with a higher boiling point.

At least one dissolving agent is used to dissolve the reducing agent. In one embodiment, the dissolving agent is at least one organic solvent. In one embodiment, the dissolving agent is at least one nonpolar organic solvent.

In one embodiment, the dissolving agent is selected from the group consisting of saturated hydrocarbons, aromatic hydrocarbons, ethers, alcohols, and combinations thereof. In one embodiment, the dissolving agent may include one or more linear or branched alkane hydrocarbons of length $C_{5-20}$. For example, the dissolving agent may include pentane, hexane, heptane, octane, nonane, decane, undecane, dodecane, tridecane, tetradecane, pentadecane, hexadecane, octadecane, nonadecane, icosane, and combinations thereof.

In one embodiment, the dissolving agent may include one or more cyclic hydrocarbons of length $C_{6-20}$. For example, the dissolving agent may include cyclohexane, cycloheptane, cyclooctane, cyclononane, cyclodecane, decalin, and combinations thereof.

In one embodiment, the dissolving agent may include aromatic hydrocarbons. For example, the dissolving agent may include benzene, toluene, xylene, and tetralin. In one embodiment, the dissolving agent is xylene.

In one embodiment, the dissolving agent may include a linear ether, a branched ether, or a cyclic ether. In one embodiment, the dissolving agent may include a linear or branched ether. For example, the dissolving agent may include dimethyl ether, diethyl ether, dipropyl ether, dibutyl ether, methyl t-butyl ether, and combinations thereof. In one embodiment, the dissolving agent is diethyl ether. In one embodiment, the dissolving agent may include one or more cyclic ethers. For example, the dissolving agent may include tetrahydrofuran, tetrahydropyran, dihydropyran, and 1,4-dioxane.

In one embodiment, the dissolving agent is an alcohol. In one embodiment, the dissolving agent is a primary alcohol, a secondary alcohol, or tertiary alcohol. In one embodiment, the alcohol is selected from the group consisting of propanols, butanols, pentanols, hexanols, and octanols combinations thereof. In one embodiment, the alcohol is selected from the group consisting of 1-propanol, 2-propanol, 1-methoxy-2-propanol, 2-amino-2-methyl-1-propanol, 1-butanol, 2-butanol, 1-pentanol, 2-pentanol, 3-pentanol, 1-hexanol, 2-hexanol, 3-hexanol, 1-octanol, 2-octanol, 3-octanol, tetrahydrofurfuryl alcohol, cyclopentanol, terpineol, and combinations thereof. In one embodiment, the dissolving agent is 2-amino-2-methyl-1-propanol.

In one embodiment, an amount of dissolving agent is added so that the reducing agent is substantially dissolved or completely dissolved in the dissolving agent. In one embodiment, "substantially dissolved" means the reducing agent has a solubility in the dissolving agent at 25° C. of about 100-500 g/L.

In one embodiment, the reducing agent dissolves in an amount from about 0.5 mL to about 2.0 mL dissolving agent. In one embodiment, the reducing agent dissolves in an amount from about 1.0 mL to about 2.0 mL dissolving agent. In some embodiments, the reducing agent dissolves in about 0.5 mL, about 1.0 mL, about 1.5 mL, or about 2.0 mL dissolving agent.

In one embodiment, the reducing agent dissolves in an amount from about 0.5 mL to about 2.0 mL diethyl ether. In one embodiment, the reducing agent dissolves in an amount from about 1.0 mL to about 2.0 mL diethyl ether. In some embodiments, the reducing agent dissolves in about 0.5 mL, about 1.0 mL, about 1.5 mL, or about 2.0 mL diethyl ether.

In one embodiment, the dissolving agent comprises two organic solvents. In one embodiment, the volume ratio of two organic solvents is about 1 to about 1 of the first organic solvent to the second organic solvent. In one embodiment, the volume ratio of the two organic solvents is about 2 to about 1 of the first organic solvent to the second organic solvent. In one embodiment, the volume ratio of the two organic solvents is about 3 to about 1 of the first organic solvent to the second organic solvent. In one embodiment, the volume ratio of the two organic solvents is about 4 to about 1 of the first organic solvent to the second organic solvent.

Reducing Agents

As previously discussed, reducing agents are disclosed. In one embodiment, at least one reducing agent is mixed with the at least one metal salt or metal complex. In one embodiment, the reducing agent reduces a metal salt to a metal. In one embodiment, the reducing agent reduces the metal of the metal salt or metal complex to form the conductive structure.

Any suitable metal precursor may be used. In one embodiment, the metal precursor comprises M(I) or the +1 oxidation state, where M represents a metal salt. In one embodiment, the metal precursor comprises M(II) or the +2 oxidation state. In one embodiment, the metal precursor comprises M(III) or the +3 oxidation state. In one embodiment, the metal precursor comprises M(III) or the +3 oxidation state. In one embodiment, the metal precursor comprises M(IV) or the +4 oxidation state. In one embodiment, the metal precursor comprises M(V) or the +5 oxidation state. In one embodiment, the metal precursor comprises M(VI) or the +6 oxidation state. In one embodiment, the metal precursor comprises M(VII) or the +7 oxidation state. In one embodiment, the metal precursor comprises M(VIII) or the +8 oxidation state. In one embodiment, an amount of reducing agent is used to completely reduce the metal salt to a metal with an oxidation state of 0. In one embodiment, the reducing agent is capable of reducing a metal ion $M^+$, $M^{2+}$, $M^{3+}$, $M^{4+}$, $M^{5+}$, $M^{6+}$, $M^{7+}$, or $M^{8+}$ to a metal $M^0$. In one embodiment, a relatively small amount of reducing agent is used. In one embodiment, the viscosity does not depend on the amount of the reducing agent.

In one embodiment, the reducing agent is selected from the group consisting of alkali metal hydrides, a complex hydride of an alkali metal and boron, a complex hydride of an alkali metal and aluminum, formates, beta ketocarboxylates, and combinations thereof.

In one embodiment, the reducing agent is a metal hydride. For example, the reducing agent may include lithium hydride, sodium hydride, potassium hydride, rubidium hydride, cesium hydride, and combinations thereof. In one embodiment, the reducing agent is lithium hydride.

In one embodiment, the reducing agent is a complex hydride of an alkali metal and boron. In one embodiment, the reducing agent is selected from the group consisting of lithium borohydride, sodium borohydride, potassium borohydride, and combinations thereof.

In one embodiment, the reducing agent is a complex hydride of an alkali metal and aluminum. In one embodiment, the reducing agent is selected from the group consisting of lithium aluminum hydride, sodium aluminum hydride, potassium aluminum hydride, and combinations thereof. In one embodiment, the reducing agent is lithium aluminum hydride.

In one embodiment, the reducing agent is a formate. In one embodiment, the reducing agent is selected from the group consisting of sodium formate, potassium formate, ammonium formate, and combinations thereof. In one embodiment, the reducing agent is a beta ketocarboxylate.

In one embodiment, the reducible metal complex is formed by adding from about 0.1 mL to about 1 mL of reducing agent. In one embodiment, the reducible metal complex is formed by adding from about 0.1 mL to about 0.8 mL of reducing agent. In one embodiment, the reducible metal complex is formed by adding from about 0.1 mL to about 0.7 mL of reducing agent. In one embodiment, the reducible metal complex is formed by adding from about 0.1 mL to about 0.6 mL of reducing agent. In one embodiment, the reducible metal complex is formed by adding from about 0.2 mL to about 0.6 mL of reducing agent. In one embodiment, the reducible metal complex is formed by adding from about 0.2 mL to about 0.5 mL, of reducing agent. In one embodiment, the reducible metal complex is formed by adding from about 0.2 mL to about 0.6 mL of reducing agent. In one embodiment, the reducible metal complex is formed by adding from about 0.3 mL to about 0.4 mL of reducing agent. In some embodiments, the reducible metal complex is formed by adding about 0.1 mL, about 0.2 mL, about 0.3 mL, about 0.4 mL, about 0.5 mL, about 0.6 mL, about 0.7 mL, about 0.8 mL, about 0.9 mL, or about 1.0 mL reducing agent.

In one embodiment, the reducible metal complex is formed by adding from about 0.1 mL to about 1 mL of lithium aluminum hydride. In one embodiment, the reducible metal complex is formed by adding from about 0.1 mL to about 0.8 mL of lithium aluminum hydride. In one embodiment, the reducible metal complex is formed by adding from about 0.1 mL, to about 0.7 mL of lithium aluminum hydride. In one embodiment, the reducible metal complex is formed by adding from about 0.1 mL to about 0.6 mL of lithium aluminum hydride. In one embodiment, the reducible metal complex is formed by adding from about 0.2 mL to about 0.6 mL of lithium aluminum hydride. In one embodiment, the reducible metal complex is formed by adding from about 0.2 mL to about 0.5 mL of lithium aluminum hydride. In one embodiment, the reducible metal complex is formed by adding from about 0.2 mL to about 0.6 mL of lithium aluminum hydride. In one embodiment, the reducible metal complex is formed by adding from about 0.3 mL to about 0.4 mL of lithium aluminum hydride. In other embodiments, the reducible metal complex is formed by adding lithium aluminum hydride in an amount of about 0.1 mL, about 0.2 mL, about 0.3 mL, about 0.4 mL, about 0.5 mL, about 0.6 mL, about 0.7 mL, about 0.8 mL, about 0.9 mL, or about 1.0 mL.

In one embodiment, the reducible metal complex is formed by adding from about 0.1 mL to about 1 mL of lithium hydride. In one embodiment, the reducible metal complex is formed by adding from about 0.1 mL to about 0.8 mL of lithium hydride. In one embodiment, the reducible metal complex is formed by adding from about 0.1 mL to about 0.7 mL of lithium hydride. In one embodiment, the reducible metal complex is formed by adding form about 0.1 mL to about 0.6 mL of lithium hydride. In one embodiment, the reducible metal complex is formed by adding from about 0.2 mL to about 0.6 mL of lithium hydride. In one embodiment, the reducible metal complex is formed by adding from about 0.2 mL to about 0.5 mL of lithium hydride. In one embodiment, the reducible metal complex is formed by adding from about 0.2 mL to about 0.6 mL of lithium hydride. In one embodiment, the reducible metal complex is formed by adding from about 0.3 mL to about 0.4 mL of lithium hydride. In other embodiments, the reducible metal complex is formed by adding lithium hydride in the amount of about 0.1 mL, about 0.2 mL, about 0.3 mL, about 0.4, about 0.5 mL, about 0.6 mL, about 0.7 mL, about 0.8 mL, about 0.9 mL, or about 1.0 mL.

Decomposition

In one aspect, the reducible metal complex is decomposed on a substrate to form a conductive structure on the substrate. In one embodiment, the reducible metal complex is decomposed by heating the reducible metal complex at a temperature of about 270° C. or less. In some embodiments, the reducible metal complex is decomposed by heating the reducible metal complex at a temperature of about 260° C. or less, about 250° C. or less, about 240° C. or less, about 230° C. or less, about 220° C. or less, about 210° C. or less, about 200° C. or less, about 190° C. or less, about 180° C. or less, about 170° C. or less, about 160° C. or less, about 150° C. or less, about 140° C. or less, about 130° C. or less, about 120° C. or less, about 110° C. or less, about 100° C. or less, about 90° C. or less, about 80° C. or less, or about 70° C. or less. In one embodiment, the reducible metal complex is heated by a heat source. Examples of heat sources include an IR lamp, oven, or a heated substrate.

In one aspect, a reducible metal complex is decomposed by mixing a catalyst with the reducible metal complex to form a catalytic reducible metal complex. In one embodiment, the catalytic reducible metal complex is decomposed at a temperature less than the temperature that is required to decompose a reducible metal complex. In one embodiment, the catalytic reducible metal complex is heated to a temperature of about 220° C. or less, about 210° C. or less, about 200° C. or less, about 190° C. or less, about 180° C. or less, about 170° C. or less, about 160° C. or less, about 150° C. or less, about 140° C. or less, about 130° C. or less, about 120° C. or less, about 110° C. or less, about 100° C. or less, about 90° C. or less, about 80° C. or less, or about 70° C. or less.

In one embodiment, the catalyst is a hydride abstractor. In one embodiment, the catalyst is a carbonyl extractor. In one embodiment, the catalyst is selected from the group consisting of a titanium (IV) compound, phenazine methosulfate, phenazine ethosulfate, 1-methoxyphenazine methosulfate, Meldola Blue, and combinations thereof. In one embodiment, the catalyst is a titanium (IV) compound. In one embodiment, the catalyst is selected from the group consisting of titanium (IV) oxide, titanium (IV) sulfide, titanium (IV) nitrate, titanium (IV) alkoxide, and combinations thereof. In one embodiment, the titanium (IV) alkoxide is either titanium (IV) isopropoxide or titanium (IV) 2-ethylhexyloxide. In one embodiment, the catalyst is titanium (IV) ethoxide.

In one aspect, a reducible metal complex is decomposed by exposing the reducible metal complex to a light source at a wavelength from about 100 nm to about 1500 nm. In one embodiment, a reducible metal complex is decomposed by exposing the reducible metal complex to a light source such as a Xenon lamp or IR lamp at a wavelength from about 100 nm to about 1000 nm. In one embodiment, a reducible metal complex is decomposed by exposing the reducible metal complex to a light source at a wavelength from about 100 nm to about 700 nm. In one embodiment, a reducible metal complex is decomposed by exposing the reducible metal complex to a light source at a wavelength from about 100 nm to about 500 nm. In one embodiment, a reducible metal complex is decomposed by exposing the reducible metal complex to a light source at a wavelength from about 100 nm to about 300 nm. In some embodiments, a reducible metal complex is decomposed by exposing the reducible metal complex to a light source at a wavelength of about 100 nm, about 200 nm, about 300 nm, about 400 nm, about 500 nm, about 600 nm, about 700 nm, about 800 nm, about 900 nm, or about 1000 nm.

In one aspect, a reducing agent is not needed to form the ink composition because the metal complex comprises a metal with an oxidation state of zero. In one embodiment, an ink composition for making a conductive structure includes a metal (0) complex comprising a Group 4, 5, 6, 7, 8, 9, 10, 11, or 12 metal, wherein the metal has an oxidation state of zero. The metal (0) complex is decomposed on a substrate to form a conductive structure. In one embodiment, the metal (0) complex is decomposed by heating the metal (0) complex at a temperature of about 270° C. or less. In one embodiment, the metal (0) complex is heated by a heat source. Examples of heat sources include an IR lamp, oven, or a heated substrate. In one embodiment, the metal (0) complex is decomposed by mixing a catalyst with the metal hydride complex to form a catalytic metal (0) complex, wherein the catalytic metal (0) complex is heated to a temperature of about 220° C. or less. In one embodiment, the metal (0) complex is decomposed by exposing the metal (0) complex to a light source at a wavelength from about 100 nm to about 1500 nm. In one embodiment, the light source is a Xenon lamp or an IR lamp.

In one embodiment, a chemical additive is added to the metal complex to prevent the surface of the ink from oxidizing at elevated temperatures. In one embodiment, the chemical additive prevents the surface of the ink from oxidizing at an elevated temperature of about 25° C. In one embodiment, the chemical additive prevents the surface of the ink from oxidizing at an elevated temperature of about 30° C. In one embodiment, the chemical additive prevents the surface of the ink from oxidizing at an elevated temperature of about 35° C. In one embodiment, the chemical additive prevents the surface of the ink from oxidizing at an elevated temperature of about 40° C.

In one embodiment, the chemical additive complexes with the surface of the metal. In one embodiment, the chemical additive complexes with copper. In one embodiment, the chemical additive is selected from the group consisting of acid sulfites, sodium thiosulfate, ammonium thioglycolate, diisopropylammonium nitrite, benzotriazole, pentaerythritol tetranitrate, and dicyclohexylammonium nitrite. In one embodiment, the chemical additive is benzotriazole.

Ink Composition Combinations of Metals and/or Metal Complexes, Dissolving Agents, and Reducing Agents In one embodiment, the metal of at least one metal salt or metal complex is selected from the group consisting of selected from the group consisting of aluminum, magnesium, titanium, silicon, vanadium, zinc, tin, copper, nickel, palladium, zirconium, iron, niobium, germanium, manganese, chromium, cobalt, tungsten, molybdenum, bismuth, ruthenium, and combinations thereof. In one embodiment, the reducing agent is lithium aluminum hydride. In one embodiment, the reducing agent is lithium hydride. In one embodiment, the dissolving agent is diethyl ether. In one embodiment, the conductive structure is an elemental metal or a metal alloy.

The reducing agent and metal salts and complexes are mixed together in different molar ratios. In one embodiment, the molar ratio of the reducing agent that is mixed with the at least one metal salt or metal complex depends upon the oxidation state of the metal of the at least one metal salt or metal complex. In one embodiment, the molar ratio of the reducing agent to the at least one metal salt or metal complex is equal to the oxidation state of the metal of the at least one metal salt or metal complex. For example, if the metal of the metal salt or metal complex has an oxidation state of +2, the molar ratio of the reducing agent to the at least one metal salt or metal complex is 2:1, or 2.

In one embodiment, if the metal has an oxidation state of +1, the reducing agent is added to the at least one metal salt or metal complex in a molar ratio of 1:1 of reducing agent to metal salt or metal complex. In one embodiment, if the metal has an oxidation state of +2, the reducing agent is added to the at least one metal salt or metal complex in a molar ratio of 2:1 of reducing agent to metal salt or metal complex. In one embodiment, if the metal has an oxidation state of +3, the reducing agent is added to the at least one metal salt or metal complex in a molar ratio of 3:1 of reducing agent to metal salt or metal complex. In one embodiment, if the metal has an oxidation state of +4, the reducing agent is added to the at least one metal salt or metal complex in a molar ratio of 4:1 of reducing agent to metal salt or metal complex. In one embodiment, if the metal has an oxidation state of +5, the reducing agent is added to the at least one metal salt or metal complex in a molar ratio of 5:1 of reducing agent to metal salt or metal complex. In one embodiment, if the metal has an oxidation state of +6, the reducing agent is added to the at least one metal salt or metal complex in a molar ratio of 6:1 of reducing agent to metal salt or metal complex. In one embodiment, if the metal has an oxidation state of +7, the reducing agent is added to the at least one metal salt or metal complex in a molar ratio of 7:1 of reducing agent to metal salt or metal complex.

Specular reflection, as known to one of ordinary skill, is the mirror-like reflection of light from a surface, in which light from a single incoming direction is reflected into a single outgoing direction. The specular reflectance of the conductive structure is a by-product of the extremely low root mean square (RMS) values of the conductive structure. In some embodiments, the conductive structure has a RMS value of about 15 nanometers or less, about 14 nanometers or less, about 13 nanometers or less, about 12 nanometers or less, about 11 nanometers or less, about 10 nanometers or less, about 9 nanometers or less, about 8 nanometers or less, about 7 nanometers or less, about 6 nanometers or less, or about 5 nanometers or less.

In one embodiment, the electrical conductivity of the conductive structures is measured. In one embodiment, the electrical conductivity of the conductive structures is about $1\times10^{-6}$ Ohm-cm or greater. In one embodiment, the electrical conductivity of the conductive structures is from about $1\times10^{-6}$ Ohm-cm to about $8\times10^{-4}$ Ohm-cm. In one embodiment, the electrical conductivity of the conductive structures is from about $3\times10^{-6}$ Ohm-cm to about $6\times10^{-6}$ Ohm-cm. In some embodiments, the electrical conductivity of the conductive structures is at least about $1\times10^{-6}$ Ohm-cm, about $2\times10^{-6}$ Ohm-cm, about $3\times10^{-6}$ Ohm-cm, about $4\times10^{-6}$ Ohm-cm, about $5\times10^{-6}$ Ohm-cm, about $6\times10^{-6}$ Ohm-cm, about $7\times10^{-6}$ Ohm-cm, about $8\times10^{-6}$ Ohm-cm, about $9\times10^{-6}$ Ohm-cm, about $1\times10^{-5}$ Ohm-cm, about $2\times10^{-5}$ Ohm-cm, about $3\times10^{-5}$ Ohm-cm, about $4\times10^{-5}$ Ohm-cm, about $5\times10^{-5}$ Ohm-cm, about $6\times10^{-5}$ Ohm-cm, about $7\times10^{-5}$ Ohm-cm, about $8\times10^{-5}$ Ohm-cm, about $9\times10^{-5}$ Ohm-cm, about $1\times10^{-4}$ Ohm-cm, about $2\times10^{-4}$ Ohm-cm, about $3\times10^{-4}$ Ohm-cm, about $4\times10^{-4}$ Ohm-cm, about $5\times10^{-4}$ Ohm-cm, about $6\times10^{-4}$ Ohm-cm, or about $7\times10^{-4}$ Ohm-cm. In one embodiment, the electrical conductivity of the conductive structures is at most about $8\times10^{-4}$ Ohm-cm, $7\times10^{-4}$ Ohm-cm, about $6\times10^{-4}$ Ohm-cm, about $5\times10^{-4}$ Ohm-cm, about $4\times10^{-4}$ Ohm-cm, about $3\times10^{-4}$ Ohm-cm, about $2\times10^{-4}$ Ohm-cm, or about $1\times10^{-4}$ Ohm-cm, about $9\times10^{-5}$ Ohm-cm, about $8\times10^{-5}$ Ohm-cm, about $7\times10^{-5}$ Ohm-cm, about $6\times10^{-5}$ Ohm-cm, about $5\times10^{-5}$ Ohm-cm, about $4\times10^{-5}$ Ohm-cm, about $3\times10^{-5}$ Ohm-cm, about $2\times10^{-5}$ Ohm-cm, about $1\times10^{-5}$ Ohm-cm, about $9\times10^{-6}$ Ohm-cm, about $8\times10^{-6}$ Ohm-cm, about $7\times10^{-6}$ Ohm-cm, about $6\times10^{-6}$ Ohm-cm, about $5\times10^{-6}$ Ohm-cm, about $4\times10^{-6}$ Ohm-cm, about $3\times10^{-6}$ Ohm-cm, or about $2\times10^{-6}$ Ohm-cm.

Magnesium Conductive Structures

In one embodiment, the conductive structure is magnesium. In one embodiment, the conductive structure is formed by mixing lithium hydride and a magnesium halide to form a magnesium hydride complex.

Zinc Conductive Structures

In one embodiment, the conductive structure is zinc. In one embodiment the conductive structure is formed by mixing lithium aluminum hydride with a zinc halide to form a zinc hydride complex.

Aluminum Conductive Structures

In one embodiment, the conductive structure is aluminum. In one embodiment, the conductive structure is formed by mixing lithium aluminum hydride, dissolved in diethyl ether, with anhydrous aluminum chloride under argon gas to form an aluminum hydride complex. In one embodiment, lithium chloride precipitates upon mixing the lithium aluminum hydride with the anhydrous aluminum chloride.

In one embodiment, the aluminum hydride complex is heated under argon gas at a temperature of 250° C. to create a pure aluminum film. In one embodiment, the aluminum hydride complex is catalytically decomposed using a titanium complex, such as a titanium (IV) compound, as a hydride abstractor to create an aluminum film at decomposition temperatures from about 180° C. to about 200° C. In one embodiment, broad wavelength light is used to drive the decomposition of the aluminum hydride complex. In one embodiment, the aluminum films have a conductivity of about 30% of the bulk aluminum. In one embodiment, the aluminum films are highly reflective appearing as the bulk metal.

Nickel Conductive Structures

In one embodiment, the conductive structure is nickel. In one embodiment, the conductive structure is formed by mixing nickel tetracarbonyl with a carbonyl extractor to form a nickel (0) complex.

In one embodiment, the conductive structure is formed by mixing nickel (0) alkene and dissolving the nickel (0) alkene complex to form an ink. In one embodiment, the ink decomposes at a temperature of 80° C. to form a nickel conductive structure.

Copper Conductive Structures

In one embodiment, the conductive structure is copper. In one embodiment, the conductive structure is formed by dissolving copper formate in 2-amino-2-methyl-1-propanol to form a copper complex.

In one embodiment, the conductive structure is formed by mixing the copper complex with benzotriazole to form an ink. In one embodiment, the ink decomposes at a temperature of 120° C. to form a copper conductive structure.

In one embodiment, the conductive structure is formed by mixing the copper complex with benzotriazole and a catalyst. The ink then decomposes at a temperature of 80° C. to form a copper conductive structure. In one embodiment, the catalyst is either a silver complex or a palladium complex.

Titanium Alloy Conductive Structures

In one embodiment, the conductive structure is a titanium alloy. In one embodiment, the titanium alloy is formed by mixing lithium aluminum hydride, a vanadium complex, and a titanium salt to form a titanium hydride complex. In one embodiment, the vanadium complex is either vanadyl acetylacetonate or vanadium hexacarbonyl.

Aluminum Alloy Conductive Structures

In one embodiment, the conductive structure is an aluminum alloy. In one embodiment, the aluminum alloy is formed by mixing a silicon alkyl complex, an aluminum salt, and a lithium aluminum hydride to form an aluminum hydride complex. In one embodiment, the silicon alkyl complex is tetraethylsilane.

In one embodiment, the ink composition is about 0.2 wt. % to about 1.0 wt. % alkyl silicon complex of the aluminum alloy. In one embodiment, the ink composition is about 0.4 wt. % to about 0.8 wt. % alkyl silicon complex of the aluminum alloy. In some embodiments, the ink composition is about 0.2 wt. %, about 0.3 wt. %, about 0.4 wt. %, about 0.5 wt. %, about 0.6 wt. %, about 0.7 wt. %, about 0.8 wt. %, about 0.9 wt. %, or about 1.0 wt. % alkyl silicon complex of the aluminum alloy. In one embodiment, the conductive structure is 6061 aluminum.

Copper Alloy Conductive Structures

In one embodiment, the conductive structure is a copper alloy. In one embodiment, the copper alloy is formed by mixing a silicon alkyl complex, a copper salt, and a beta ketocarboxylate to form a copper beta ketocarboxylate complex. In one embodiment, the silicon alkyl complex is tetraethylsilane.

In one embodiment, the ink composition is about 0.1 wt. % to about 0.6 wt. % alkyl silicon complex of the copper alloy. In one embodiment, the ink composition is about 0.15 wt. % to about 0.4 wt. % alkyl silicon complex of the copper alloy. In some embodiments, the ink composition is about 0.1 wt. %, about 0.2 wt. %, about 0.3 wt. %, about 0.4 wt. %, about 0.5 wt. %, or about 0.6 wt. % alkyl silicon complex of the copper alloy.

Magnesium Alloy Conductive Structures

In one embodiment, the conductive structure is a magnesium alloy. In one embodiment, the magnesium alloy is formed by mixing a silicon alkyl complex, a magnesium salt, and a lithium hydride to form a magnesium hydride complex. In one embodiment, the silicon alkyl complex is tetraethylsilane.

In one embodiment, the ink composition is about 0.5 wt. % to about 1.5 wt. % alkyl silicon complex of the magnesium alloy. In one embodiment, the ink composition is about 0.8 wt. % to about 1.2 wt. % alkyl silicon complex of the magnesium alloy. In some embodiments, the ink composition is about 0.5 wt. %, about 0.6 wt. %, about 0.7 wt. %, about 0.8 wt. %, about 0.9 wt. %, about 1.0 wt. %, about 1.1 wt. %, about 1.2 wt. %, about 1.3 wt. %, about 1.4 wt. %, or about 1.5 wt. % alkyl silicon complex of the magnesium alloy.

Nickel Alloy Conductive Structures

In one embodiment, the conductive structure is a nickel alloy. In one embodiment, the nickel alloy is formed by mixing a nickel salt and a cyclic alkene to create a nickel (0) complex.

Methods for Making Ink Compositions

In one aspect, a method of making a conductive structure is disclosed. In one embodiment, the method includes the step of mixing reducing agent with a metal of at least one metal salt or metal complex to form a reducible metal complex. In one embodiment, the reducing agent is dissolved in at least one dissolving agent. In one embodiment, the reducing agent is a hydride. In some embodiments, the reducing agent is either a formate or a beta ketocarboxylate. In one embodiment, the method also includes the step of applying the reducible metal complex to a substrate. In one embodiment, the step of mixing a reducing agent with at least one metal salt or metal complex occurs prior to applying the reducible metal complex to the substrate. In one embodiment, the method also includes the step of decomposing the reducible metal complex on the substrate to form the conductive structure. In one embodiment, the reducible metal complex is formed in the presence of argon gas or nitrogen gas.

In one embodiment, the method of forming the reducible metal complexes is formed under anhydrous conditions. In one embodiment the use of anhydrous conditions depends on the metal salt or metal complex used to form the reducible metal complex. In one embodiment, anhydrous conditions are used for making inks with reduction potentials of about −0.15V or lower, of about −0.25V or lower, or of about −0.35V or lower. In one embodiment, anhydrous conditions are used to prevent disproportionation reactions from occurring during the decomposition or annealing of the reducible metal complex. For example, anhydrous conditions are used when making copper hydride complexes.

In one embodiment, the step of decomposing the reducible metal complex on the substrate to form the conductive structure comprises heating the reducible metal complex at a temperature of about 270° C. or less. In some embodiments, the step of decomposing the reducible metal complex on the substrate to form the conductive structure comprises heating the reducible metal complex at a temperature of about 260° C. or less, about 250° C. or less, about 240° C. or less, about 230° C. or less, about 220° C. or less, about 210° C. or less, about 200° C. or less, about 190° C. or less, about 180° C. or less, about 170° C. or less, about 160° C. or less, about 150° C. or less, about 140° C. or less, about 130° C. or less, about 120° C. or less, about 110° C. or less, about 100° C. or less, about 90° C. or less, about 80° C. or less, or about 70° C. or less. In one embodiment, the reducible metal complex is heated by a heat source. Examples of heat sources include an IR lamp, oven, or heated substrate.

In one embodiment, the step of decomposing the reducible metal complex on the substrate to form the conductive structure comprises mixing a catalyst with the reducible metal complex to form a catalytic reducible metal complex. In one embodiment, the catalyst is mixed with the reducing agent and the metal salt or metal complex prior to the forming the reducible metal complex. In one embodiment, the catalyst is mixed with the reducible metal complex before the reducible metal complex is applied to the substrate. In one embodiment, the catalyst is mixed with the reducible metal complex after the reducible metal complex is applied to the substrate.

In one embodiment, the catalytic reducible metal complex is heated to a temperature of about 220° C. or less, about 210° C. or less, about 200° C. or less, about 190° C. or less, about 180° C. or less, about 170° C. or less, about 160° C. or less, about 150° C. or less, about 140° C. or less, about 130° C. or less, about 120° C. or less, about 110° C. or less, about 100° C. or less, about 90° C. or less, about 80° C. or less, or about 70° C. or less.

In one embodiment, the catalyst is a hydride abstractor. In one embodiment, the catalyst is a carbonyl extractor. In one embodiment, the catalyst is selected from the group consisting of a titanium (IV) compound, phenazine methosulfate, phenazine ethosulfate, 1-methoxyphenazine methosulfate, Meldola Blue, and combinations thereof. In one embodiment, the catalyst is a titanium (IV) compound. In one embodiment, the catalyst is selected from the group consisting of titanium (IV) oxide, titanium (IV) sulfide, titanium (IV) nitrate, titanium (IV) alkoxide, and combinations thereof. In one embodiment, the titanium (IV) alkoxide is either titanium (IV) isopropoxide or titanium (IV) 2-ethylhexyloxide. In one embodiment, the catalyst is titanium (IV) ethoxide.

In one embodiment, the step of decomposing the reducible metal complex on the substrate to form the conductive structure comprises exposing the reducible metal complex to a light source at a wavelength from about 100 nm to about 1500 nm. In one embodiment, the step of decomposing the reducible metal complex on the substrate to form the conductive structure comprises exposing the reducible metal complex to a light source a Xenon lamp or IR lamp at a wavelength from about 100 nm to about 1000 nm. In one embodiment, the step of decomposing the reducible metal complex on the substrate to form the conductive structure comprises exposing the reducible metal complex to a light source at a wavelength from about 100 nm to about 700 nm. In one embodiment, the step of decomposing the reducible metal complex on the substrate to form the conductive structure comprises exposing the reducible metal complex to a light source at a wavelength from about 100 nm to about 500 nm. In one embodiment, the step of decomposing the reducible metal complex on the substrate to form the conductive structure comprises exposing the reducible metal complex to a light source at a wavelength from about 100 nm to about 300 nm. In some embodiments, the step of decomposing the reducible metal complex on the substrate to form the conductive structure comprises exposing the reducible metal complex to a light source at a wavelength of about 100 nm, about 200 nm, about 300 nm, about 400 nm, about 500 nm, about 600 nm, about 700 nm, about 800 nm, about 900 nm, or about 1000 nm.

In one embodiment, the reducing agent is dissolved in the dissolving agent prior to adding the reducing agent. In one embodiment, the reducing agent is mixed with the reducing agent prior to dissolving the reducing agent in the dissolving agent. In one embodiment, the reducing agent, dissolving agent, and the at least one metal salt or metal complex are added simultaneously.

In one embodiment, the reducible metal complex has a desired viscosity. In one embodiment, the desired viscosity is obtained using a microVISC viscometer. In one embodiment, the reducible metal complex has a viscosity from about 50 centipoise to about 1000 centipoise. In one embodiment, the reducible metal complex has a viscosity from about 5 centipoise to about 50 centipoise. In one embodiment, the reducible metal complex has a viscosity from about 10 centipoise to about 40 centipoise. In one embodiment, the reducible metal complex has a viscosity from about 20 centipoise to about 30 centipoise. In one embodiment, the reducible metal complex has a viscosity from about 18 centipoise to about 20 centipoise. In some embodiments, the reducible metal complex has a viscosity of about 18, about 19, or about 20 centipoise.

In one embodiment, the viscosity of the complex is adjusted based upon the amount of dissolving agent used. In one embodiment, the viscosity of the complex is adjusted based upon the type of dissolving agent used. In one embodiment, the viscosity of the complex is adjusted based upon the amount of diethyl ether used. In one embodiment, increasing the amount of diethyl ether increases the viscosity of the reducible metal complex.

Further, the viscosity of the complex is adjusted based upon the amount of reducing agent that is added. If more reducing agent is used, the viscosity of the reducible metal complex increases. In one embodiment, the viscosity of the reducible metal complex can be increased to well over 1000 centipoise by increasing the amount of reducing agent. In one embodiment, the viscosity of the reducible metal complex can be increased to well over 1000 centipoise by increasing the amount of reducing agent from about 0.2 mL to about 0.6 mL. In one embodiment, if less reducing agent is used, the viscosity of the reducible metal complex decreases.

Applications of the Ink Compositions

The ink compositions can be used in various printing applications, including slot die coating, spin coating, roll-to-roll printing, including gravure, flexography, rotary screen printing, screen printing, aerosol jet printing, inkjet printing, airbrushing, Mayer rod coating, flood coating, 3D printing, and electrohydrodynamic painting. Furthermore, patterns can be created using photolithography to create a mask to etch the metal from certain areas, thereby creating high-fidelity features.

In one embodiment, the reducible metal complex is compatible with many nonpolar polymer substrates, glasses, and ceramic substrates where polar complexes do not wet particularly well. In one embodiment, the reducible metal complex is applied to a polymer substrate. In one embodiment, the reducible metal complex is applied to a nonpolar polymer substrate. In one embodiment, the reducible metal complex is applied to a glass substrate. In one embodiment, the reducible metal complex is applied to a ceramic substrate.

Furthermore, elastomers and 3D substrates with specifically non-planar topography can be used in conjunction with the conductive structures. In one embodiment, the reducible metal complex is applied to an elastomer. In one embodiment, the reducible metal complex is applied to a 3D substrate.

The specular reflectance of the conductive structure is a by-product of the extremely low RMS values of the conductive structure. In one embodiment, the RMS value of the conductive structure is about 10 nanometers or less. In one embodiment, the conductive structure is used on substrates with smooth surfaces. In one embodiment, the conductive structure is used for electrode structures for fine features to prevent electromigration. Another embodiment is used to create structural features from an alloy.

EXAMPLES

Other uses, embodiments and advantages of the conductive structures are further illustrated by the following examples, but the particular materials and amounts cited in these examples, as well as other conditions and details, should not be construed to unduly limit the conductive structures.

Example 1

In one embodiment, about 0.5 grams silver neodecanoate is dissolved in a mixture of about 0.5 mL xylene and about 0.5 mL terpineol. About 0.2 mL tert-octylamine is added to the silver neodecanoate dissolved in xylene and terpineol. The silver complex has a viscosity from about 18 centipoise to about 20 centipoise. If more terpineol is used and less xylene is used, the viscosity of the complex increases. If more amine is used, the viscosity of the complex increases. The viscosity of this complex can be tuned from about 5 centipoise by using excess xylene to about 50 centipoise by using excess terpineol. The viscosity can be further increased to over 1000 centipoise by increasing the amount of tert-octylamine from about 0.2 mL to about 0.6 mL.

Upon patterning the silver complex ink, the ink is heated to a temperature from about 180° C. to about 200° C. After approximately 5 minutes after patterning the ink, the xylene and terpineol is mostly evaporated and the conductive structure film begins to yellow. After approximately 10 to 15 minutes after patterning, the film begins to turn reddish brown. After approximately 20-30 minutes after patterning the ink, the film begins to turn black and then convert to a metallic silver luster that eventually covers the entire film, thereby denoting the entire complex has decomposed to a metallic, conductive structure.

The conductive structure has an electrical conductivity from about $3 \times 10^{-6}$ Ohm-cm to about $6 \times 10^{-6}$ Ohm-cm. The specular reflectance of the conductive structure is a byproduct of the extremely low RMS values of the conductive structure. The RMS value of the conductive structure is about 10 nanometers or less.

Example 2

In one embodiment, about 0.5 grams silver neodecanoate is dissolved in about 1 mL xylene. 0.2 mL 2-ethylhexylamine is added to the silver neodecanoate dissolved in xylene. The silver complex has a viscosity from about 18 centipoise to about 20 centipoise. If more 2-ethylhexylamine is used, the viscosity of the complex increases. The viscosity can be increased to over 1000 centipoise by increasing the amount of 2-ethylhexylamine from about 0.2 mL to about 0.6 mL.

Upon patterning the silver complex ink, the ink is heated to a temperature of about 190° C. After approximately 5 minutes after patterning the ink, the xylene is mostly evaporated and the conductive structure film begins to yellow. After approximately 10 to 15 minutes after patterning, the film begins to turn reddish brown. After approximately 20-30 minutes after patterning the ink, the film begins to turn black and then convert to a metallic silver luster that eventually covers the entire film, thereby denoting the entire complex has decomposed to a metallic, conductive structure.

The conductive structure has an electrical conductivity from about $2 \times 10^{-6}$ Ohm-cm to about $1 \times 10^{-5}$ Ohm-cm. The specular reflectance of the conductive structure is a byproduct of the extremely low RMS values of the conductive structure. The RMS value of the conductive structure is about 10 nanometers or less.

Example 3

In one embodiment, about 0.4 grams silver hexafluoroacetylacetonate is dissolved in about 1 mL xylene. About 0.2 mL tert-octylamine is added to the silver hexafluoroacetylacetonate dissolved in xylene. The silver complex has a viscosity from about 18 centipoise to about 20 centipoise. If more tert-octylamine is used, the viscosity of the complex increases. The viscosity can be increased to over 1000 centipoise by increasing the amount of tert-octylamine from about 0.2 mL to about 0.6 mL.

Upon patterning the silver complex ink, the ink is heated to a temperature of about 160° C. After approximately 5 minutes after patterning the ink, the xylene is mostly evaporated and the conductive structure film begins to yellow. After approximately 10 to 15 minutes after patterning, the film begins to turn reddish brown. After approximately 20-30 minutes after patterning the ink, the film begins to turn black and then convert to a metallic silver luster that eventually covers the entire film, thereby denoting the entire complex has decomposed to a metallic, conductive structure.

The conductive structure has an electrical conductivity from about $2 \times 10^{-6}$ Ohm-cm to about $1 \times 10^{-5}$ Ohm-cm. The specular reflectance of the conductive structure is a byproduct of the extremely low RMS values of the conductive structure. The RMS value of the conductive structure is about 10 nanometers or less.

Example 4

0.5 grams (0.179 mmol) of silver neodecanoate was dissolved in 2 mL of xylene. The solution had a viscosity of 6 cPs. Upon the addition of 0.4 mL (2.49 mmol) of tert-octyl amine, the solution's viscosity increased to 100 cPs. Further addition (>0.8 mL) of tert-octyl amine resulted in the complete gellation of the solution and a resulting viscosity of 10000 cPs.

Example 5

Lithium aluminum hydride is mixed with an ethereal solution of aluminum chloride in a molar ratio of 3:1 of lithium aluminum hydride to aluminum chloride. Upon mixing of the lithium aluminum hydride with the aluminum chloride, lithium chloride is precipitated leaving an ethereal solution of aluminum hydride. A small amount of titanium (IV) ethoxide is added to the ethereal solution. The resulting solution is then heated at 140° C. to create an aluminum film.

Example 6

Lithium aluminum hydride is mixed with an ethereal solution of aluminum chloride in a molar ratio of 3:1 of lithium aluminum hydride to aluminum chloride. Upon mixing of the lithium aluminum hydride with the aluminum chloride, lithium chloride is precipitated leaving an ethereal solution of aluminum hydride. This solution is heated to 180-200° C. to create an aluminum film.

Example 7

Lithium hydride is mixed with an ethereal solution of tetraethylsilane and magnesium hydride in a molar ratio of 4:1 of lithium hydride to the mixture of tetraethylsilane and magnesium hydride. Upon mixing of the lithium hydride with the mixture of tetraethylsilane and magnesium hydride, lithium silicate is precipitated leaving an ethereal solution of magnesium hydride complex. A small amount of titanium (IV) ethoxide is added to the ethereal solution. The resulting solution is then heated at 140° C. to create an aluminum alloy.

Example 8

Lithium hydride is mixed with an ethereal solution of tetraethylsilane and magnesium hydride in a molar ratio of 4:1 of lithium hydride to the mixture of tetraethylsilane and magnesium hydride. Upon mixing of the lithium hydride with the mixture of tetraethylsilane and magnesium hydride, lithium silicate is precipitated leaving an ethereal solution of magnesium hydride complex. The resulting solution is then heated at 180-200° C. to create an aluminum alloy.

Example 9

Lithium aluminum hydride is mixed with an ethereal solution of zinc chloride in a molar ration of 2:1 of lithium aluminum hydride to zinc chloride. Upon mixing of the lithium aluminum hydride with zinc chloride, lithium chloride is precipitated leaving an ethereal solution of zinc hydride. A small amount of titanium (IV) ethoxide is added to the ethereal solution. The resulting solution is then heated at 140'C to create a zinc film.

Example 10

Lithium aluminum hydride is mixed with an ethereal solution of zinc chloride in a molar ration of 2:1 of lithium aluminum hydride to zinc chloride. Upon mixing of the lithium aluminum hydride with zinc chloride, lithium chloride is precipitated leaving an ethereal solution of zinc hydride. The resulting solution is then heated at 140-200° C. to create a zinc film.

Although the invention herein has been described in connection with described embodiments thereof, it will be appreciated by those skilled in the art that additions, modifications, substitutions, and deletions not specifically described may be made without departing from the spirit and scope of the invention as defined in the appended claims. It is therefore intended that the foregoing detailed description be regarded as illustrative rather than limiting, and that it be understood that it is the following claims, including all equivalents, that are intended to define the spirit and scope of this invention.

What is claimed:

1. A method of preparing an ink composition, comprising:
   adding a metallic salt with a sterically bulky counter ion in a solvent to form a first mixture; and
   adding a ligand to the first mixture to form an ink composition;
   wherein the metallic salt is selected from the group consisting of silver, copper, nickel, gold, platinum, palladium, aluminum, magnesium, zinc, and tin salts;
   wherein the ligand is selected from the group consisting of tert-butylamine, 2-methylbutan-2-amine, 2-methylpentan-2-amine, 2-ethylhexylamine, 2-ethylheptylamine, N-ethylhexan-1-amine, N-ethylheptan-1-amine, unsubstituted or substituted pyrrolidine, and combinations thereof; and
   wherein the resulting ink composition is a stable, particle-free ink composition at room temperature.

2. The method of claim 1, wherein the sterically bulky counter ion is selected from the group consisting of carboxylate, cyanide, sulfonate, borate, phosphate, and perchlorate.

3. The method of claim 1, wherein the sterically bulky counter ion is $R^1COO^-$; wherein $R^1$ is selected from the group consisting of substituted alkyl, unsubstituted or substituted cycloalkyl, and unsubstituted or substituted heterocycloalkyl.

4. The method of claim 3, wherein $R^1$ is a substituted $C_1$-$C_{30}$ alkyl.

5. The method of claim 3, wherein $R^1$ is $C_1$-$C_{30}$ alkyl substituted with at least one of alkyl and keto groups.

6. The method of claim 1, wherein the sterically bulky counter ion is selected from the group consisting of neodecanoate, 2-ethyloctanoate, 2-ethylhexanoate, 2-ethylpentanoate, 2-ethylbutylnoate, 2-ethyl-2-methylbutanoate, 2,2-diethylbutanoate, 3-oxobutanoate, 3-oxopentanoate, and 3-oxohexanoate and combinations thereof.

7. The method of claim 6, wherein the sterically bulky counter ion is neodecanoate.

8. The method of claim 1, wherein the metallic salt is a silver salt.

9. The method of claim 8, wherein the sterically bulky counter ion is $R^1COO^-$; wherein $R^1$ is selected from the group consisting of substituted alkyl, unsubstituted or substituted cycloalkyl, and unsubstituted or substituted heterocycloalkyl.

10. The method of claim 9, wherein $R^1$ is a substituted $C_1$-$C_{30}$ alkyl.

11. The method of claim 10, wherein $R^1$ is $C_1$-$C_{30}$ alkyl substituted with at least one of alkyl and keto groups.

12. The method of claim 11, wherein the sterically bulky counter ion is selected from the group consisting of neodecanoate, 2-ethyloctanoate, 2-ethylhexanoate, 2-ethylpentanoate, 2-ethylbutylnoate, 2-ethyl-2-methylbutanoate, 2,2-diethylbutanoate, 3-oxobutanoate, 3-oxopentanoate, and 3-oxohexanoate and combinations thereof.

13. The method of claim 12, wherein the sterically bulky counter ion is neodecanoate.

* * * * *